United States Patent [19]
Shirai et al.

[11] Patent Number: 5,383,162
[45] Date of Patent: Jan. 17, 1995

[54] SEMICONDUCTOR MEMORY DEVICE

[75] Inventors: Masaki Shirai, Sayama; Hisahiro Moriuchi, Tanashi; Yasuhiro Yoshii, Kodaira; Kenichi Kuroda, Tachikawa; Akinori Matsuo, Higashiyamato, all of Japan

[73] Assignees: Hitachi, Ltd.; Hitachi VLSI Engineering Corp., Tokyo, Japan

[21] Appl. No.: 935,176

[22] Filed: Aug. 26, 1992

[30] Foreign Application Priority Data

Aug. 26, 1991 [JP] Japan .................... 3-240479

[51] Int. Cl.⁶ ............... H01L 27/10; G11C 11/40
[52] U.S. Cl. ................... 365/231; 365/200; 365/230.06; 365/230.01; 257/314
[58] Field of Search ........... 365/104, 231, 200, 230.01, 365/230.06; 257/314

[56] References Cited

FOREIGN PATENT DOCUMENTS 58-98977 6/1983 Japan.
61-225862 10/1986 Japan.
4-92476 3/1992 Japan.

Primary Examiner—Viet Q. Nguyen
Attorney, Agent, or Firm—Antonelli, Terry, Stout & Kraus

[57] ABSTRACT

A non-volatile memory element comprising a control gate formed by a diffusion layer, a floating gate comprising a conductive layer, the floating gate being partly overlapping with the control gate through a thin insulating layer, and a barrier layer formed to cover a part or the entire part of the floating gate is used as a defect remedy circuit for the memory circuit having read-only memory elements arranged in the form of a matrix for storing defective addresses corresponding to the word lines and bit lines and storing data corresponding thereto respectively.

28 Claims, 15 Drawing Sheets

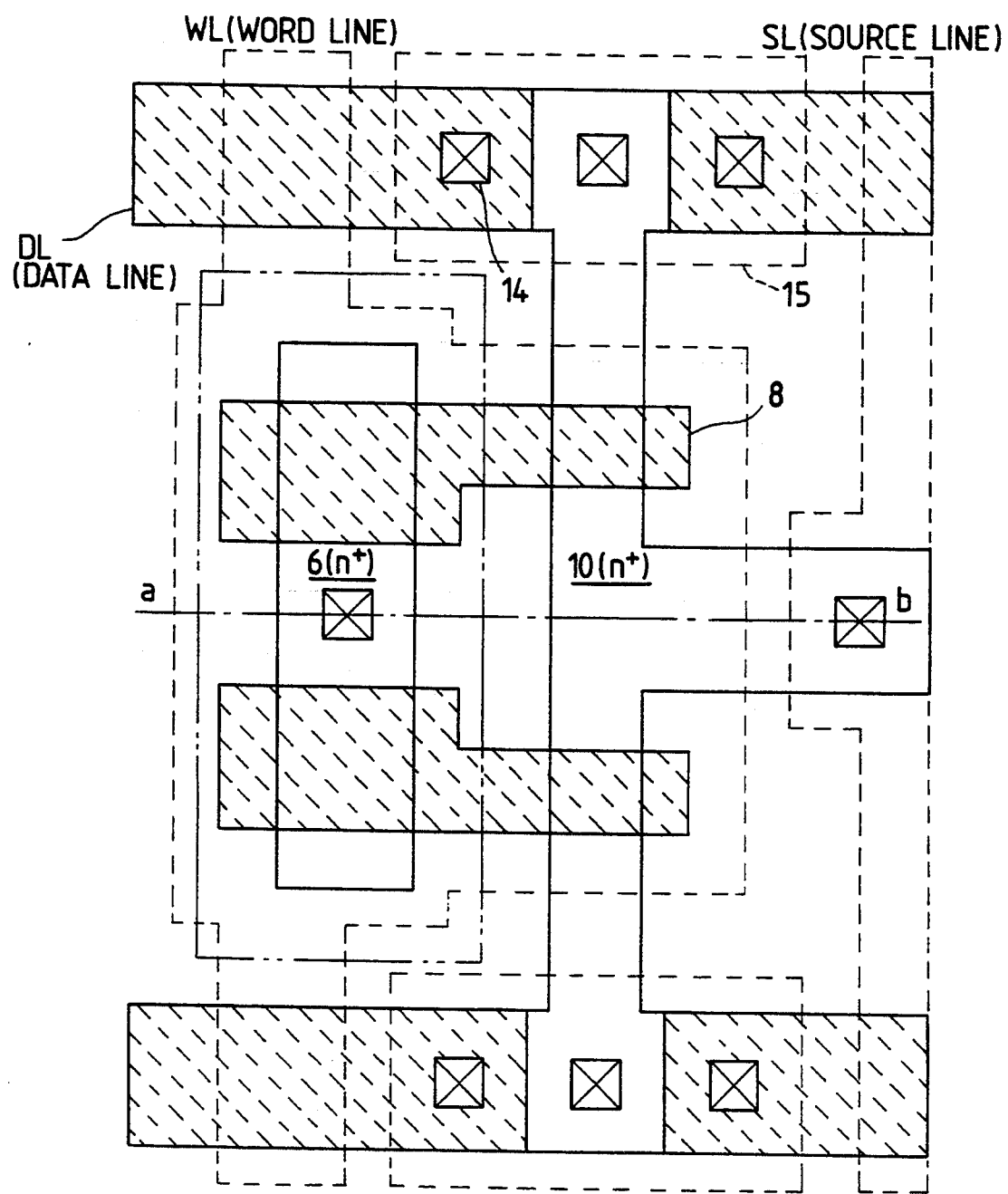

SEMICONDUCTOR MEMORY DEVICE

BACKGROUND OF THE INVENTION

The present invention relates to a semiconductor memory device and, particularly, to technology for implementing defect remedy schemes for a mask type ROM (Read-Only Memory) of a type utilizing non-volatile memory element of a single layer polysilicon gate structure.

It is a known technology to use an EPROM (Erasable & Programmable Read-Only Memory) in a defect remedy and with respect to the updating of data to be stored in a mask type ROM. The technology for using a single layer polysilicon gate structure in an EPROM is described, for instance, in the Technical Search Report of Japanese Electronics Information and Communication Society, Vol. 90, No. 47, pp. 51 to 53, issued on May 21, 1990.

SUMMARY OF THE INVENTION

The present patent application is related to copending U.S. patent application Ser. No. 07/727,409, filed on Jul. 9, 1991.

The inventors of the present invention have found the following phenomenon through analysis of data storing characteristics in an EPROM.

FIG. 16 illustrates data storing characteristics of respective EPROMs having different structures. The horizontal axis indicates time, while the vertical axis depicts variation rates of threshold voltage $[\Delta Vth_t + \Delta Vth_0 \times 100]\%$. Here, $\Delta Vth_0$ indicates a threshold voltage at the writing period, while $\Delta Vth_t$ the threshold voltage after passage of time t. The data storing characteristics have also been determined under the environmental condition in which a device has been allowed to stand at an ambient temperature of 300° C.

In FIG. 16, the characteristic B corresponds to the element structure such as an EPROM having the single layer polysilicon gate structure, while the characteristic D corresponds to the element structure such as an EPROM having the double-layer gate structure. The inventors of the present invention have surmised, based on differences determined of data storing characteristics of both such types of EPROMs, that a control gate in the double-layer gate structure works as a barrier to prevent reduction of information charges accumulated in a floating gate. In order to confirm this phenomenon, an EPROM having a single layer polysilicon gate structure was provided with an aluminum layer formed on the entire surface of a floating gate consisting of the single layer polysilicon. Based on data of the storing characteristic thereof, there became evident a remarkable improvement in data storing characteristics of such an EPROM. This improvement is indicated by the characteristic A. Moreover, in the case of having provided an oxide film (P-SiO) on the upper part of an element, having the double-layer gate structure, formed by the plasma CVD method, it has also been determined that an excellent .data storing characteristic, such as that indicated by the characteristic C, can be obtained. This oxide film (P-SiO) is formed as an interlayer insulating film for double layer aluminum wiring. Namely, it is an EPROM of the double-layer gate structure, wherein the aluminum layer as the first layer is formed on a BPSG (Boron-Doped Phospho-Silicate Glass) film and an aluminum layer as the second layer is formed thereon through the oxide film (P-SiO).

The inventors of the present invention have succeeded in using a non-volatile storing element for effecting a defect remedy of a mask type ROM, in which the non-volatile storing element is of the single layer gate structure having an improved data storing characteristic. Such an improved characteristic is based on the results obtained of careful analysis of the relationship between such an element structure and the data storing characteristic thereof.

It is, therefore, an object of the present invention to provide a semiconductor memory device comprising a defect remedy circuit ensuring simplified structure and high reliability.

The aforementioned and other objects and novel features of the present invention will become apparent from the description and the accompanying drawings of the specification.

A brief summary of the improved disclosed aspects typifying the present invention will be explained hereinbelow.

Namely, as a defect remedy circuit for a memory circuit having read-only memory elements arranged in the form of matrix, a non-volatile memory element comprising a control gate formed by a diffused layer, a floating gate comprising a conductive layer, said floating gate being partly overlapping with the control gate through the insulating film, and a barrier layer formed to partly or entirely cover the floating gate is used to realize a memory associated with defective addresses corresponding to the word line and bit lines and data memory respectively corresponding thereto.

According to the means described previously, a highly reliable defect remedy can be realized by utilizing a simple structured non-volatile memory element, since radical hydrogen(which may be assumed to be diffused from a final passivation film at the element surface) is seized by the barrier layer and thereby breakdown of information charges accummulated in the floating gate can be prevented.

BRIEF DESCRIPTION OF THE DRAWINGS

FIG. 2 illustrates an element pattern diagram of an embodiment of a non-volatile memory element for the use in a redundant circuit of a semiconductor memory device of the present invention;

FIG. 1a illustrates a flowchart for explaining an embodiment of readout operation of remedy data;

DESCRIPTION OF THE PREFERRED EMBODIMENTS

Figure 1A:
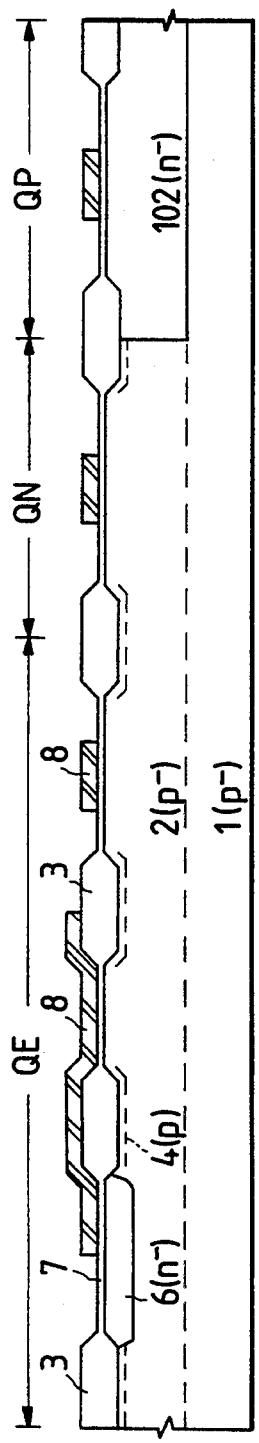
FIGS. 1(A) to 1(C) illustrate sectional views of the manufacturing steps of an embodiment for explaining a non-volatile memory element of the present invention.
Figure 1B:
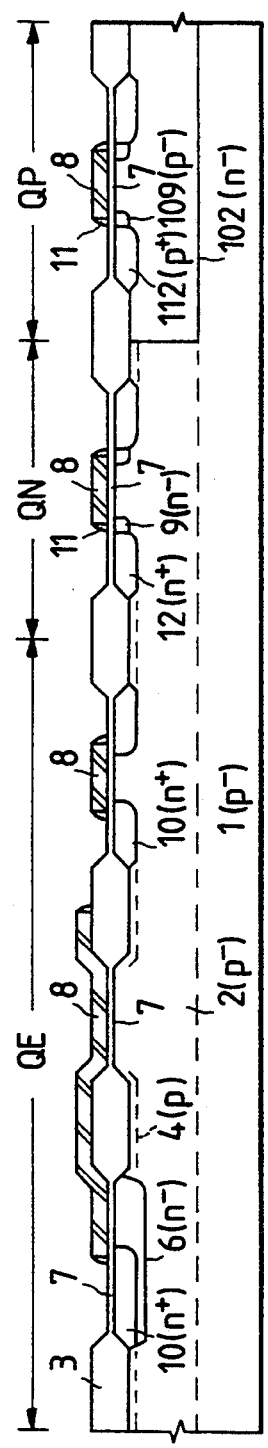
Figure 1C:
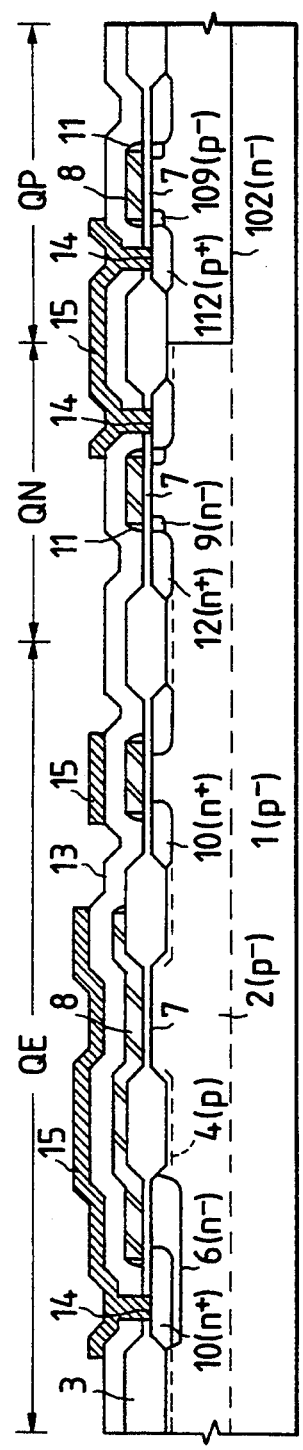

FIGS. 1(A) to (C) illustrate sectional views of a non-volatile memory element in the manufacturing steps to be used in the present invention. These diagrams simultaneously illustrate N channel MOSFETs and P channel MOSFETs which are also formed together with a non-volatile memory element. In this specification, MOSFET means an insulated gate type field effect transistor (IGFET). In FIGS. 1(A) to (C), a non-volatile memory element QE of the single layer polysilicon gate structure, an N channel MOSFET QN and a P channel MOSFET QP are indicated sequentially from the left side. The N channel MOSFET QN and P channel MOSFET QP are used to form a peripheral circuit such as an address selection circuit of the non-volatile memory element QE, another memory circuit formed on the same semiconductor substrate as the EPROM of the present invention and a peripheral circuit such as an address selection circuit thereof. Moreover, a non-volatile memory element QE has a sectional view in the perpendicular direction to the source and drain in the lower side and in the parallel direction thereto in the higher side.

In FIG. 1(A), a P type well 2 and an N type well 102 are formed by the known method on the principle surface of a P type semiconductor substrate 1. With a known means, a thick field insulating film 3 and a P channel stopper 4 indicated thereunder with a dotted line in the same figure are formed. An N type diffused layer 6 to be used as a control gate of the non-volatile memory element QE is then formed. In this case, this N type diffused layer 6 is formed, although not restricted, by implanting phosphorus, with the ion implanting method, in the concentration of about $1 \times 10^{14}$ cm$^{-2}$ with acceleration energy of 80 KeV through an insulating film and thereafter, providing heat treatment for about 30 minutes at a temperature of 950° C. under an atmospheric condition including oxygen of about 1% within nitrogen. It is of course possible, in this case, to use only arsenic or both arsenic and phosphorus. Basically, in addition, heat treatment is not required but such heat treatment is recommended for recovery of the semiconductor substrate 1 damaged by such ion implantation.

Next, after the insulating film which is damaged by such ion implantation is removed, a clean gate insulating film 7 is formed by the hot oxidation method. In this case, the upper gate insulating film 7 of the N type diffused layer 6 is formed thicker than the region not forming the N type diffused layer 6 by 10 to 20 percent. Moreover, the floating gate of the non-volatile memory element QE and a conductive layer 8 which becomes the gate electrode of the N channel MOSFET QN and P channel MOSFET QP are formed. This conductive layer 8 is formed by a polycrystalline silicon (polysilicon) film or a polycide film including a silicide film on the upper pare of a polycrystalline silicon film.

As shown in FIG. 1(B), N channel diffused layers 9 and 10, and the P type diffused layer 109 are formed. The N type diffused layer 9 is formed, with the ion implantation method, by implanting phosphorus in the concentration of about $2 \times 10^{13}$ cm$^{-2}$ under the acceleration energy of 50 KeV. The N type diffused layer 10 is formed, with the ion implantation method, by implanting phosphorus in the concentration of about $5 \times 10^{15}$ cm$^{-2}$ under the acceleration energy of 50 KeV. The P type diffused layer 109 is formed, with the ion implantation method, by implanting boron in the concentration of about $1 \times 10^{13}$ cm$^{-2}$ under the acceleration energy of 15 KeV. Next, after the CVD insulating film is formed on the entire surface, a side wall 71 is formed by the anisotropic etching method. Moreover, the N channel diffused layer 12 and the P type diffused layer 112 are respectively formed. The N type diffused layer 12 is formed, with the ion implantation method by implanting arsenic in the concentration of about $5 \times 10^{15}$ cm$^{-2}$ under the acceleration energy of 80 KeV. The P type diffused layer 112 is formed, with the ion implanation method, by implanting boron in the concentration of about $2 \times 10^{15}$ cm$^{-2}$ under the acceleration energy of 15 KeV. in this embodiment, the N type diffused layer 10 is explained to be formed before the formation of side wall 11, but it is also possible to form the N type diffused layer 10 after the formation of side wall 11. Moreover, the P type diffused layer 112 can be formed before the formation of side wall 11 by eliminating the manufacturing steps of the P type diffused layer 109. In this case, the N type diffused layer 9 can also be formed by the ion implantation to the entire surface without using a mask.

In FIG. 1(C), the non-volatile memory element QE is formed in the single layer gate structure having a control gate formed by diffused layers 6 and 10, a floating gate 8, a gate insulating film 7, an interlayer insulating film 7 between the control gate and floating gate, and the source and drain are formed by the N type diffused layer 110. The source and drain are structured by the N type diffused layer 10 to improve writing characteristic. The N type diffused layer 10 has the same structure as the source and drain of the N channel MOSFET QN forming the intput and output circuit. The N channel MOSFET QN has the so-called LDD structure wherein the gate electrode 8, gate insulated film 7, source and drain are formed by the N type diffused layers 9 and 12. The P channel MOSFET QP has the so-called LDD structure wherein the gate electrode 8, gate insulated film 7, source and drain are formed by the P type diffused layers 109 and 112. Respective elements are isolated by a field insulating film 3 and a P type channel stopper 4. Each element is connected to a wiring 15 consisting of aluminium through a contact hole provided in the insulating film 13. The N type diffused layers 6 and 10 operating as a control gate of the non-volatile element QE are shunted by the wiring 15 to reduce parasitic resistance. Namely, the wiring 15 forms the word line and is connected with the control gate of each non-volatile memory element. The N channel diffused layer 10 is provided for obtaining excellent ohmic contact with the wiring 15.

In this embodiment, with the view of improving the data storing characteristic of such single layer gate structure as the non-volatile memory element QE, an aluminium layer 15 is formed therefor as a barrier layer covering the entire surface of the floating gate 8 through the insulating film 13. The insulating film 13 is formed by PSG film or BPSG film. Although not restricted particularly, the aluminium layer 15, as the barrier layer to be formed to cover the entire surface of the floating gate through the insulating film 13, is integrally structured with the word line connecting the control gate of the non-volatile memory element QE. The non-volatile memory element QE in this embodiment is used for defect remedy of mask ROM, as will be explained later, and the N channel MOSFET QN is given a structure similar to that of the memory element. However, in FIG. 1(A), the N type impurity is introduced by the ion implantation method to the region where the mask type ROM is formed in order to keep therein the depletion type N channel MOSFET.

In FIG. 2, an element pattern diagram of an embodiment of the non-volatile memory element QE is illustrated.

The N type diffused layer 6 as the control gate, indicated by a dotted line in the same figure, is connected through the contact hole 14 with a word line WL consisting of the aluminium layer 15, indicated by a hatching or broken line in the same figure. The aluminium layer 15 is formed, also for use as the barrier layer of the floating gate 8, to extend in the right direction along the floating gate 8 to cover the entire surface of the floating gate 8, as can be clearly seen in the same figure. In FIG. 2, a couple of memory cells are illustrated symmetrically in the upper and lower sides of a dash-and-point line a-b. Namely, the drain of the upper non-volatile memory element QE is connected with the aluminium layer 15 through the contact hole 14. This aluminium layer 15 is connected through the line DL consisting of polysilicon layer extending to the right and left sides through the contact hole 14. Moreover, the N type diffused layer 10 forming the source of the non-volatile memory element QE is integrally formed with the source of the non-volatile memory element QE in the lower side and is extended in the right direction along the above-mentioned center line a-b up to the region not crossing the aluminium layer 15 forming the barrier layer and the aluminium layer connecting the drain to the word line consisting of the polysilicon layer and is connected to the source line SL consisting of the aluminium layer extended in the vertical direction, in other words, in parallel with the word line through the contact hole In formed therein.

The non-volatile memory element QE of the single layer gate structure of this embodiment is provided with a barrier layer made of the aluminium layer formed to cover the entire surface of the upper part of the floating gate. In this embodiment, with a view of preventing implntation of radical hydrogen into the floating gate by the diffusion method, a barrier in such a sufficient size as exceeding the size of floating gates, 8 is used.

Figure 3:
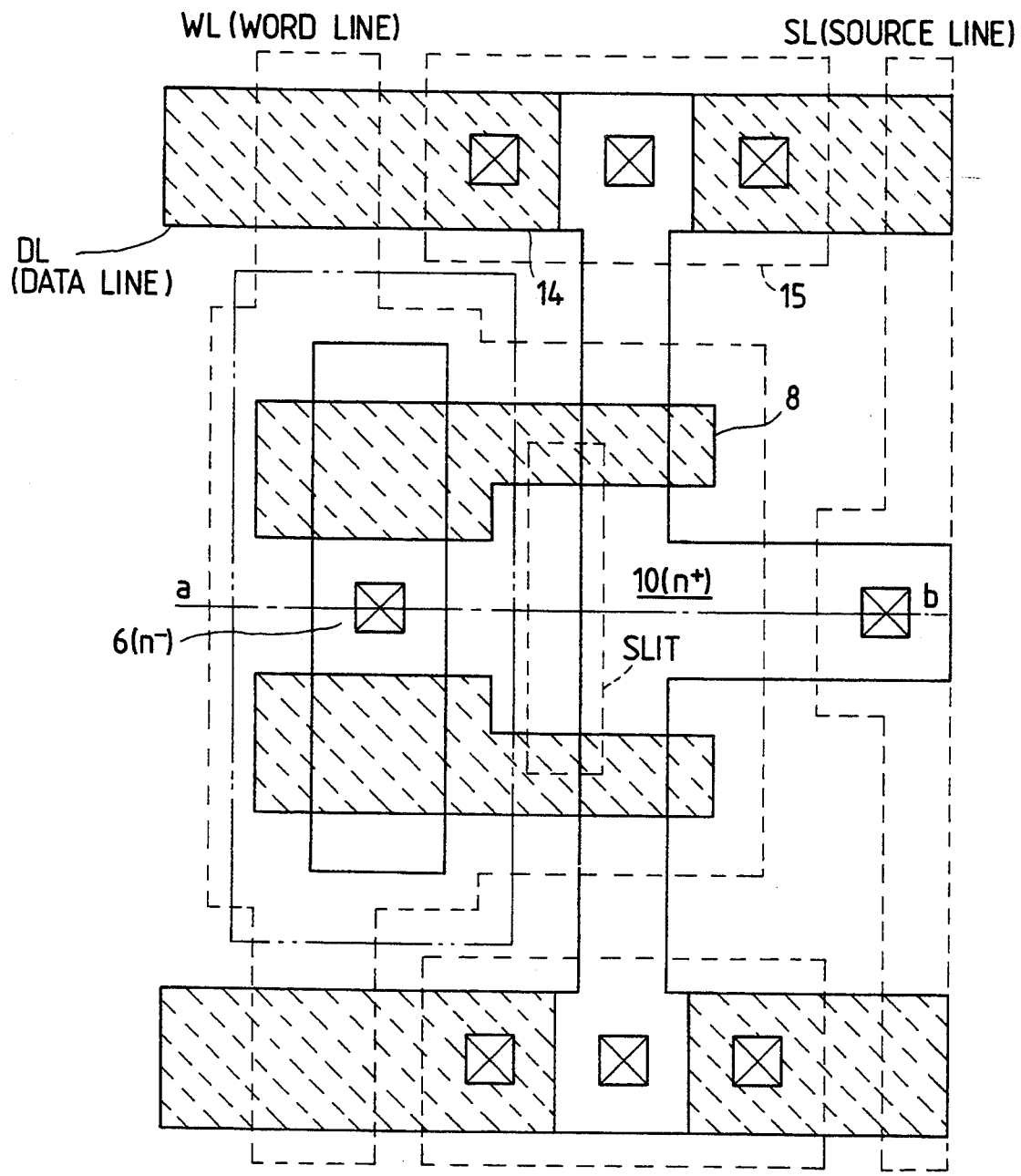
FIG. 3 illustrates an element pattern diagram of another embodiment of a non-volatile memory element for the use in a redundant circuit of a semiconductor memory device of the present invention.
Figure 16:
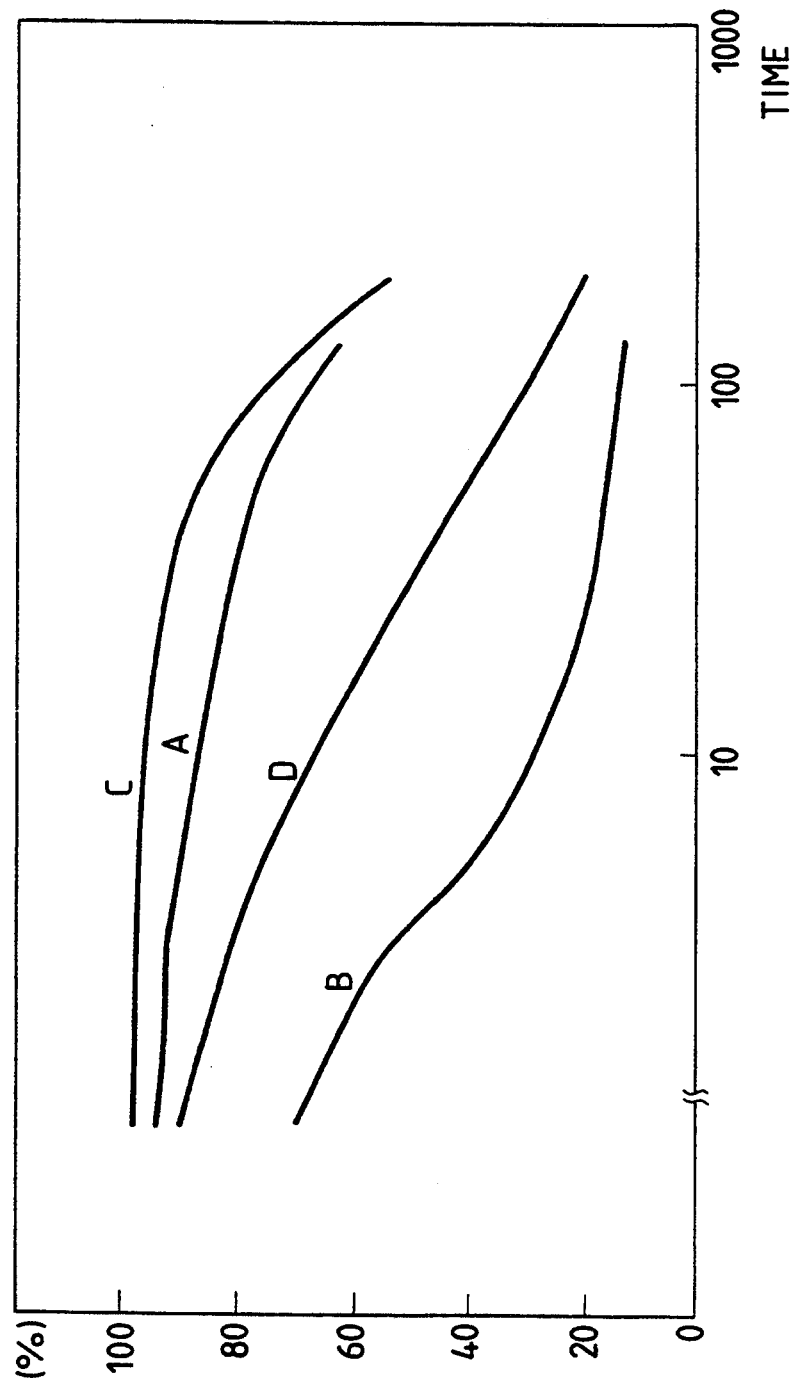
FIG. 16 illustrates data storing characteristics of different volatile memory elements with respect to explaining the present invention.

From the data storing characteristic illustrated in FIG. 16, the following estimation is possible. The characteristic D indicates a substantially improved data storing characteristic in comparison with the characteristic B. Structural difference of these characteristics is that the characteristic B corresponds to the single-layer gate structure, while the characteristic D corresponds to the double-layer gate structure. The inventors of the present invention have surmise, from these facts, that the control gate of the double-layer gate structure has the effect to allow charges to enter the floating gate and prevent the factor which depletes stored charges. In order to conform such phenomenon, an element providing the aluminium layer, such as illustrated in FIG. 1(C) or FIG. 3, as the barrier layer has been formed on the floating gate of the single-layer gate structure. The data storing characteristic thereof has been remarkably improved in comparison with the characteristic A.

One of the factors resulting in loss of information charges accumulated in the floating gate is considered because of the radical hydrogen produced from the final passivation film. That is, although not shown in FIG. 16, in the case of using a plasma nitride (P-SiN) film as the final passivation film, the data storing characteristic is deteriorated unlike that when using instead a CVD oxide (PSG) film. The difference between these films becomes large in the quantity of radical hydrogen produced. The conclusion obtained is that the aluminium layer as the barrier layer includes by itself a large amount of hydrogen and plays a role of a dam for accumulating radical hydrogen in order to prevent diffusion of hydrogen to the floating gate.

A barrier layer maybe a polysilicon layer. The polysilicon layer has the property to easily comprehend hydrogen but when it is used as the floating gate, it seizes hydrogen diffused from the final passivation film and loses information charges. On the basis of inverse application of such phenomenon, a polysilicon layer is provided as a barrier layer on the floating gate. The polysilicon layer as the barrier layer precedingly seizes and fetches the radical hydrogen diffused from the final passivation film and operates to prevent diffusion of hydrogen into the floating gate provided at the lower side thereof. As a result, as in the case of the aluminium layer, the polysilicon layer as the barrier layer plays a role of dam for the radical hydrogen and prevents entry into the floating gate.

The phenomenon explained above is based on the supposition but, as is obvious from the data storing characteristic illustrated in FIG. 16, provision of the barrier layer as explained above obviously realizes improvement in the data storing characteristic of the non-volatile memory element of the single-layer gate structure. In the case of Using the plasma nitride (P-SiN) as the final passivation film, a low cost plastic package can be used. Therefore, it is also possible to obtain a semiconductor memory device utilizing a low cost package, while improving the data storing characteristic, by providing the barrier layer which is used in this embodiment.

In the characteristic diagram of FIG. 16, the characteristic C corresponds to a non-volatile memory element of the double-layer gate structure which provides, to realize double-layer aluminium wirings, an oxide film (P-SiO) formed by the plasma CVD method as an interlayer insulating film between the first aluminium layer and the second aluminium layer. Moreover, the inventors of the present invention have found that the oxide film (P-SiO) itself also has the effect of preventing diffusion of radical hydrogen from the fact that the data storing characteristic C has showed remarkable improvement in comparison with the characteristic D of the non-volatile memory element not providing the oxide film (P-SiO) even in the same double-layer gate structure. The oxide film (P-SiO) is deposited within a plasma reaction chamber using: the monosilane (SiH$_4$)-+nitrogen oxide (N$_2$O) as the raw material gas and it can be assumed to have the effect of completely absorbing the diffused radical hydrogen since the small amount of radical hydrogen itself is contained.

Therefore, it is also possible to structure the first interlayer insulating film 13 of FIG. 1(C) with PSG film or BPSG film and the second interlayer insulating film formed thereon with the oxide film (P-SiO) film and use the plasma nitride film (P-SiN) as the final passivation film.

Figure 4:
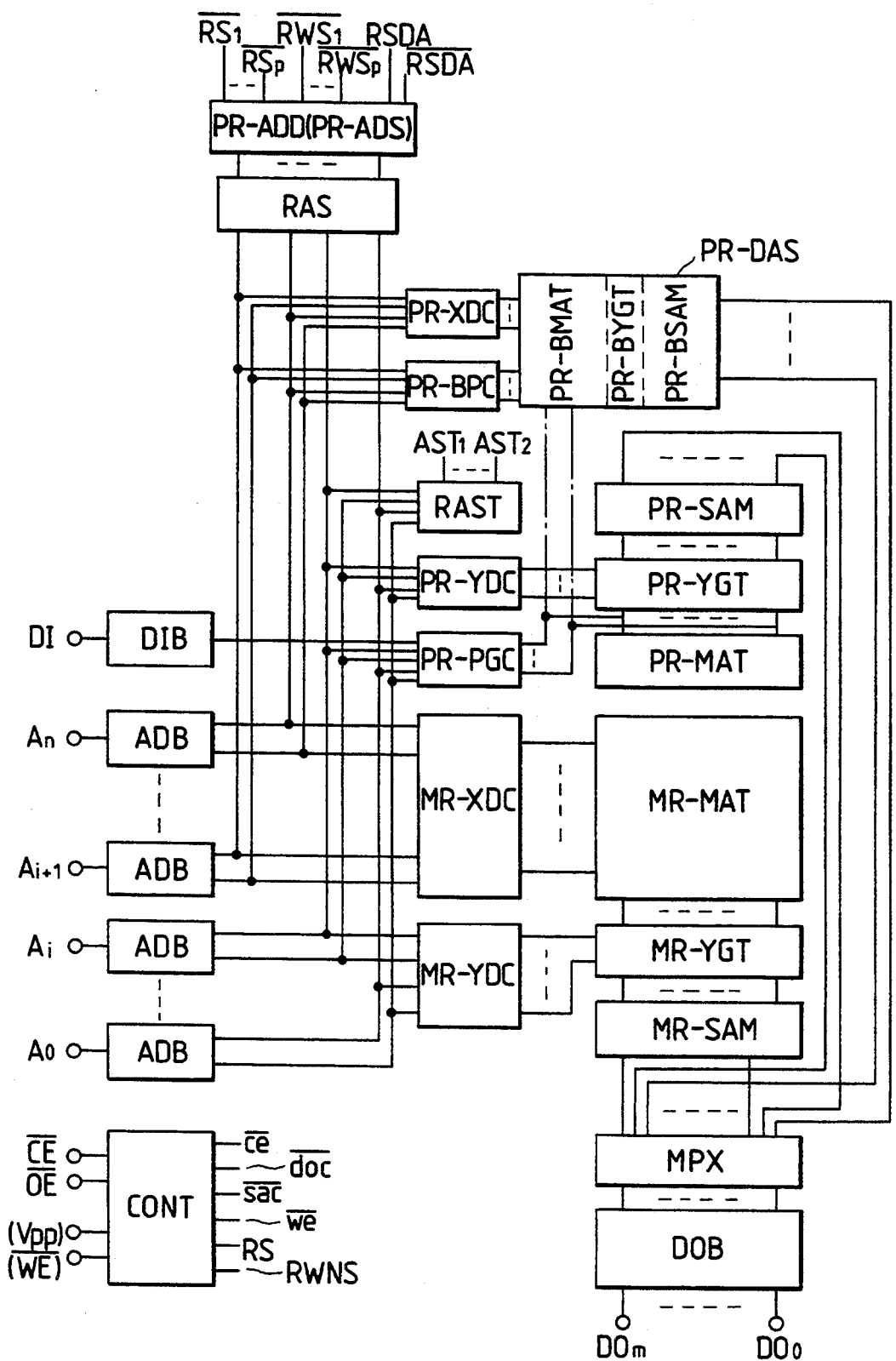
FIG. 4 illustrates a block diagram of an embodiment of a mask type ROM of the present invention.

FIG. 4 illustrates a block diagram of an embodiment of the mask type ROM of the present invention. This mask type ROM is formed on a single semiconductor substrate, such as a single crystal silicon, by the semiconductor integrated circuit manufacturing technology as explained with regard to FIG. 1. In the same figure, code expression of logical symbols conforms to an ordinary code expressing method. For example, a signal which changes to active level from low level is usually indicated by an alphabet expressing a control signal with an upper bar, however, in this specification, such signal is expressed by the alphabets with letter B (indicating a bar). For instance a chip enable signal is expressed as CEB. This rule is also adopted to the control signal of the other drawings and corresponding explanation in this specification.

A memory mat MR-MAT is structured by arranging memory elements for the mask type ROM in the form of matrix. A memory mat PR-MAT has a structure where such non-volatile memory elements of the single layer gate structure are arranged in the form of matrix and is used for remedy of defective data on the defective word lines and defective bit lines (or sometimes called as the defective data lines or defective digit lines) in the memory mat MR-MAT.

In the memory mat MR-MAT, the memory elements are arranged at the intersecting points of the word lines and data lines like the known mask ROM. The gate of the memory element is connected with word lines, while the drain to the data lines and the source to the grounding lines of the circuit, respectively. The word lines of memory mat MR-MAT are selected by the X decoder MR-XDC. The X decoder circuit MR-XDC decodes complementary internal address signals formed by the address buffer ADB which receives the X series address signals $A_{i+1}$ to $A_n$ and operates to select a single word line from a plurality of word lines in the memory mat MR-MAT.

The data lines of memory mat MR-MAT are connected with the common data lines by a column switch gate MR-YGT. This column switch gate MR-YGT operates to connect a single data line to the common data line from the memory mat-MR-MAT for each output mat, depending on the decode signal formed by the Y decode circuit MR-YDC for decoding complementary internal address signal formed by the address buffer ADB which receives the Y series address signals $A_0$ to $A_1$.

The common data line is connected with an input terminal of a sense amplifier circuit MR-SAM. This sense amplifier circuit MR-SAM amplifies stored information read from the memory elements located at the intersecting points of the selected word lines and data lines.

The memory mat PR-MAT arranges the non-volatile memory elements of the single layer gate structure explained previously in the respective intersecting points of the word lines and data lines and is used as a redundant circuit for defective data corresponding to defective word lines in the memory mat MR-MAT. The control gate of the non-volatile memory element is connected to the word lines, while the drain to the data lines and the source to the grounding lines of the circuit. A redundant word line selecting signal formed by a remedy address memory circuit PR-ADD explained later is supplied to %he word lines of this redundant memory mat PR-MAT.

The data lines of redundant memory mat PR-MAT are connected with a write data input circuit PR-PGC and the column switch gate PR-YGT. This write data input circuit PR-PGC operates to transfer the write signal to a single data line in the memory mat PR-PLAT with the complementary internal address signal formed by the address buffer ADS which receives the Y series address signals $A_0$ to $A_i$ and the data signal formed by the input buffer DIB which receives the write input data DI. The column switch gate PR-YGT explained above operates to connect a single data line to the common data line for each output mat of the redundant memory mat PR-MAT, depending on an output signal of the Y decoder PR-YDC for decoding the complementary internal address signal formed by the address buffer ADS which receives the Y series address signals $A_0$ to $A_i$.

The common data line is connected to an input terminal of the sense amplifier circuit PR-SAM. The sense amplifier circuit PR-SAM amplifies the stored information read from a memory cell (non-volatile memory element) located at an intersecting point of the word line and data line selected in the readout mode. An output signal of the sense amplifier circuit PR-SAM is inputted to the multiplexer circuit MPX for switching the sense amplifiers. This multiplexer circuit MPX selects, in the case where a defect is found in the word lines, an output signal of the sense amplifier circuit PR-SAM for redundant memory mat PR-MAT in place of an output signal of the sense amplifier circuit MR-SAM for mask ROM and transfers such output signal to an output buffer DOS. This output buffer DOS sends a readout data transferred through the multiplexer circuit MPX from the output terminals $DO_0$ to $DO_m$ In this embodiment, a redundant circuit is provided corresponding to defective bit lines. The redundant circuit PR-DAS corresponding to the defective bit lines is structured by a memory mat PR-BMAT where non-volatile memory elements of the single-layer gate structure explained above are located at respective intersecting points of the word lines and data lines, a gate circuit PR-BYGT and a sense amplifier PR-BSAM. These circuits PR-BMAT, PR-BYGT, PR-BSAM are structured in the same constitution as the circuits PR-MAT, PR-YGT, PR-SAM and are also connected mutually in the same manner. The memory mat PR-BMAT of the redundant circuit PR-DAS connects the control gate of the non-volatile memory elements to the word lines as explained above, while the drain to the date lines and the source to the grounding line of the circuit. In the redundant memory mat PR-MAT of the redundant circuit corresponding to the defective word lines, the word lines correspond to the word lines of the memory mat MR-MAT, but the word lines of redundant memory mat PR-BMAT in this redundant circuit PR-DAS correspond to the bit lines of the memory mat PR-MAT. Namely, selection of word lines of the redundant memory mat PR-BMAT enables selection of a plurality of data corresponding to defective bit lines and the redundant bit to be selected in such data is determined by the X series address signal. Therefore, in the redundant circuit PR-DAS, output signals of the X series address decoder circuits PR-XDC are supplied to the X series address decoder circuit. PR-BYGT.

An output signal of the sense amplifier circuit PR-BSAM of the redundant circuit PR-DAS is inputted to the multiplexer MPX which switches the sense amplifier circuit. This multiplexer circuit MPX selects, if a defect is found in the bit lines, an output signal of the sense amplifierPR-BSAM of the redundant circuit PR-DAS in place of an output signal of the sense amplifier MR-SAM for mask ROY and then transfers such output to the output buffer DOB. The output buffer DOB sends the readout data transferred through the multiplexer circuit MPX from the output terminals $DO_0$ to $DO_m$.

Here, it is also allowed that the gate circuit and sense amplifier are used in common by using in common the memory mat PR-MAT as the redundant circuit corresponding to defective word lines and defective bit lines to selectively supply the X and Y series address signals to the input of PR-YDC.

Although not restricted particularly, a non-volatile memory element explained above is used in this embodiment to store remedy addresses. In the writing method of the remedy address, the X series and Y series address signals formed by the address buffer circuit ADB which receives the address signals $A_0$ to $A_n$ are converted to the write data by the remedy address selection circuit RAS and are then written in the non-volatile memory elements arranged in the remedy address memory circuit PR-ADD (PR-ADS). Although not restricted particularly, the addresses of a plurality of defective word lines and bit lines can be stored in the remedy address memory circuit PR-ADD (PR-ADS). The addresses in the remedy address storing circuit PR-ADD (PR-ADS) for storing the addresses of these defective word lines and defective bit lines are determined by the redundant word line selection circuit RAST for decoding the internal address signals. Namely, the addresses (defective addresses) of the defective word lines (defective bit lines) are written into the addresses assigned by the output signals $AST_1$ to $AST_z$ of the redundant word line selection circuit RAST.

The remedy address memory circuit PR-ADD (PR-ADS) operates to store the addresses (defective addresses) to be relieved and form, when the address matching with the written address is inputted, the word line selection signals $RWS_1$ to $RWS_p$, $RWS_1B$ to $RWS_pB$ or $RWS_1$ to $RWS_pB$ in order to select the word lines of redundant memory mat PR-MAT and redundant circuit PR-DAS. Moreover, this remedy address memory circuit PR-ADD (PR-ADS) forms a signal for switching an output of the multiplexer circuit MPX.

A control circuit CONT receives a chip enable signal CEB for activating this semiconductor integrated circuit device and an output enable signal OEB for controlling the output buffer circuit DOS during the readout operation to create an activation signal ceB for each circuit block, an activation signal sacB of sense amplifier circuit MR-SAM and an activation signal docB of the output buffer circuit DOS.

Moreover, the control circuit CONT receives a high voltage signal $V_{pp}$ for a writing operation of the non-volatile memory elements (PR-MAT, PR-BMAT, PR-ADD, PR-DAS) provided for redundancy and a write enable signal WEB, although not restricted particularly, for the write operation to create an internal write control signal weB, a write control signal RS for storing remedy address and RWNS, etc. The high voltage signal $V_{pp}$ and write enable signal WEB are supplied, although not restricted particularly, to the pads $V_{pp}$ and WE provided on the semiconductor substrate. In this embodiment, these pads are not connected to external terminals (external pin). Thereby, the external pins of the mask ROM in this embodiment may be compatible with that of the mask ROM not provided with the defect remedy function. In addition, the data input terminal DI is coupled to the data output terminal (external terminal) DO.

Figure 5:
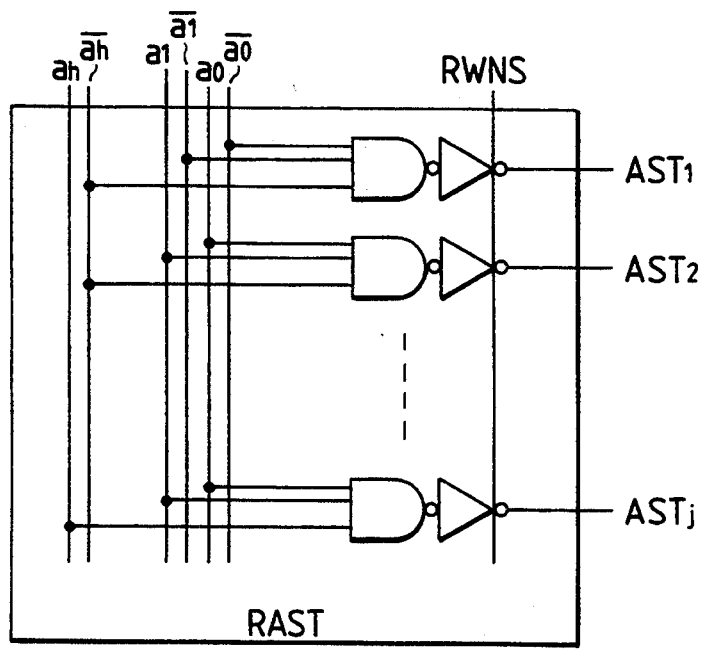
FIG. 5 illustrates a circuit diagram of an embodiment of a redundant word line selecting circuit RAST in the mask type ROM.

FIG. 5 illustrates a circuit diagram of an embodiment of the redundant word line selection circuit RAST explained above.

Although not restricted particularly, the redundant word line selection circuit RAST receives the complementary address signals $a_0$, $a_0B$ to $a_h$, $a_hB$ formed by the address buffer circuit ADS which receives the Y series address signals $A_0$ to $A_h$ ($h \leq i$) and the signal RWNS which is activated during the writing operation to the memory element of the remedy address storing circuit PR-ADD (PR-ADS) to generate storing position assignment signals $AST_1$ to $AST_j$. For instance, 16 kinds of storing position assignment signals $AST_1$ to $AST_{16}$ can be generated by utilizing 4-bit address signals $A_0$ to $A_3$. Even when eight word lines in maximum are defective in the memory mat MR-MAT, these can be replaced with the memory cells of the redundant memory mat PR-MAT by assigning the signals $AST_1$ to $AST_8$ among 16 signals to the defective word lines. Accordingly, in the case of using the remedy address memory circuit. PR-ADD as explained above, the non-volatile memory elements corresponding to eight word lines are arranged in the form of matrix in the redundant memory mat PR-MAT.

For the writing operation to the storing elements of the remedy memory circuit PR-ADS corresponding to the defective bit lines, the remaining signals of the storing position assignment signals $AST_1$ to $AST_j$ may be used by the address signals $A_0$ to $As_h$ and the signal RWNS explained above. For example, it is enough that the remaining signals $AST_g$ to $ABT_{16}$ among the 16 kinds of storing position assignment signals $AST_1$ to $AST_{16}$ correspond to the defective bit lines. Thereby, the eight defective bit lines in maximum of the memory mat MR-MAT can be replaced with the memory cells of the redundant memory mat PR-BMAT. Therefore, in the case of using the remedy address memory circuit PR-ADS as explained above, the non-volatile memory elements corresponding to such eight bit lines are arranged in the form of matrix in the redundant memory mat PR-BMAT.

Namely, the memory elements in the remedy address memory circuits PR-ADD and PR-ADS are selected by the Y series address signals $A_0$ to $A_h$ and the addresses of the defective word lines or defective bit lines are written into such selected memory elements. In this case, the external address terminal which receives the Y series address signals is used for selecting the memory elements within the remedy address memory circuit. Therefore, it is enough that the Y series address signal which indicates the defective bit lines is supplied, for example, using the X series external address terminal. Namely, in this case, the external address terminal of X series is used in common as an input terminal of both X series address signal which indicates the defective word lines and Y series address signal which indicates the defective bit lines.

As explained above, a defective address corresponding to a defective bit line can be discriminated by 16 kinds of storing position assignment signals $AST_1$ to $AST_{16}$ corresponding to the 4-bit address signals $A_0$ to $A_3$.

Figure 6:
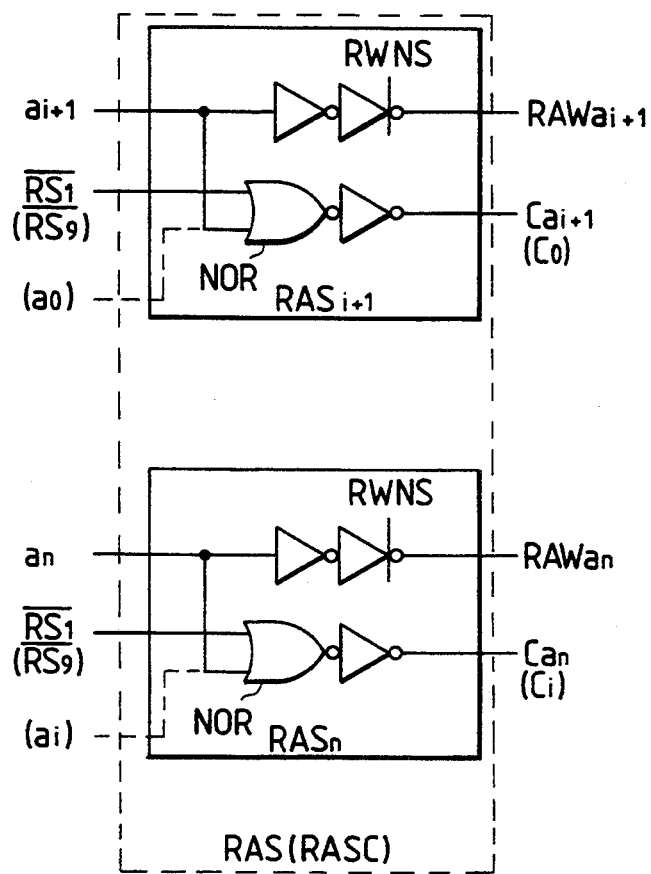
FIG. 6 illustrates a circuit diagram of an embodiment of a remedy address selecting circuit RAS in the mask type ROM.

FIG. 6 illustrates a circuit diagram of an embodiment of the remedy address selection circuit RAS. This remedy address selection circuit RAS comprises unit selection circuit RAS in such number as corresponding to the number of the assignment signals $AST_1$ to $AST_j$. That is, for example, 16 unit selection circuits comprise depending on the example explained above. Although not restricted particularly, structure is partly different between the unit selection circuit; corresponding to defective word line and unit selection circuit corresponding to defective data line. In the same figure, the unit selection circuits corresponding to defective word lines are mainly illustrated.

This remedy address unit: selection circuit RAS receives the address signals $a_{1+1}$ to $a_n$ formed by the address buffer circuit ADS which receives respectively the X series address signals $A_{i+1}$ to $A_n$ and tansfers the input address signals $A_{1+1}$ to $A_n$ to the remedy address memory circuit PR-ADD as the write data $RAW_{1+1}$ to $RAWa_n$ with the signal RWNS which is activated at the time of writing into the non-volatile memory element of the remedy address memory circuit PR-ADD. For comparison of the remedy address stored in the remedy address memory circuit PR-ADD and X series external address signal, the address signals $Ca_{1+1}$ to $Ca_n$ are generated responding to the signal $\overline{RS}_1$ formed by the memory circuit PR-ADD as explained later.

The remedy address unit selection circuit RASC corresponding to defective data line is illustrated by a broken line in the same figure (FIG. 6). This unit selection circuit RASC resembles the aforementioned unit selection circuit RAS. That is, in the unit selection circuit RAS, the address signals $a_{1+1}$ to $a_n$ and the signal $\overline{RS}_1$ are supplied to the NOR gate NOR, while in the remedy address unit selection circuit RASC corresponding to defective data line, the signal $\overline{RS}_1$ and the address signals $a_0$ to $a_1$ formed by the address buffer circuit ADB which receives the Y series address signals $A_0$ to $A_1$ are supplied to the NOR gate NOR. Other points are the same as those in the unit selection circuit RAS. The unit selection circuit RASC sends the Y series address signals $a_0$ to $a_1$ (indicated as $a_{1+1}$ to $a_n$ in the same figure) supplied through the X series external terminal to the remedy address memory circuit PR-ADS as the write data $RAW_{a0}$ to $RAW_{a1}$ (indicated as $RAWa_{1+1}$ to $RAW_n$ in the same figure). Moreover, the unit selection circuit RASC outputs the Y series address signals $Ca_0$ to $Ca_1$ corresponding to the signal $\overline{RS}_1$ for the comparison with the remedy address stored in the memory circuit PR-ADS.

The signal $\overline{RS}_1$ is formed by the remedy address memory circuits PR-ADD, PR-ADS explained hereunder.

Figure 7:
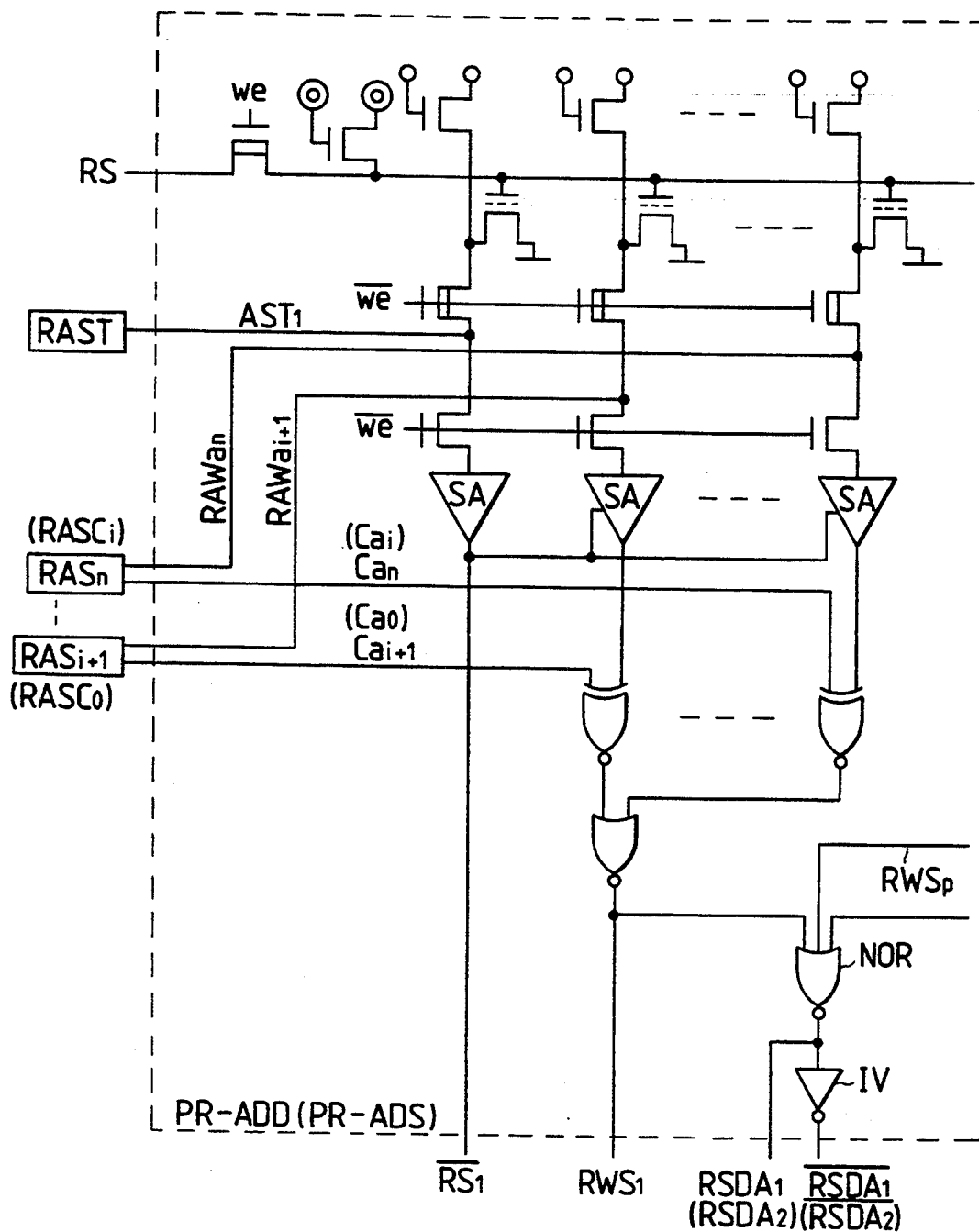
FIG. 7 illustrates a circuit diagram of an embodiment of a remedy address memory circuit PR-ADD in the mask type ROM.

FIG. 7 mainly illustrates a circuit diagram of an embodiment of the remedy address memory circuit PR-ADD. The remedy address memory circuit PR-ADD (PR-ADB) illustrated in FIG. 4 includes, although not restricted particularly, the remedy address memory circuits illustrated in FIG. 7 in such number corresponding to the number of assignment signals $ABT_1$ to $AST_1$. According to the example explained above, 16 remedy address memory circuits are included and eight circuits are memory circuits PR-ADD corresponding to defective word lines, while the remaining eight circuits are memory circuits PR-ADS corresponding to defective data lines. However, a NOR gate NOR and an inverter IV are common between the memory circuits PR-ADD corresponding to defective word lines and a NOR gate NOR and an inverter IV are common between the memory circuits PR-ADS. Moreover, the assignment signal RAS (RASC) and the memory circuit PR-ADD ADS) corresponds with each other on the one to one basis.

Next, the memory circuit PR-ADD is mainly explained as an example for the remedy address memory circuit and the explanation can also be applied to the memory circuit PR-ADS.

An address of a defective word line (defective data line) is written into the memory element by transferring the write signal RS for remedy address storing to the word line connecting the non-volatile memory element of the single,layer gate structure arranged as the memory element and also transferring the data $RAWa_{i+1}$ to $RAWa_n$ of the memory address formed by the remedy address unit selection circuit RAS (RASC) to the data line.

The data line connecting merry elements storing remedy addresses is connected to an input terminal of the sense amplifier SA and the signal is amplified by the sense amplifier SA during the readout operation. In the case of this embodiment, although not restricted particularly, a 1-bit memory element is provided as a memory element for storing remedy address in addition to such remedy address. Storing of remedy address can be confirmed and the sense amplifier SA activation signal and activation signals $RS_1B$ to $RS_p B$ to form the address comparison signals $Ca_{i+1}$ to $Ca_n$ ($Ca_0$ to $Ca_1$) of the remedy address selection circuit RAS (RASC) can be formed by storing the data of "1" or "0" information corresponding to the assignment signal into the 1-bit memory element.

When the readout operation is carried out to the memory element storing the remedy address, each output signal of the sense amplifier SA is inputted to an exclusive OR circuit for confirming coincidence or not coincidence with the address comparison signals $Ca_{i+1}$ to $Ca_n$($Ca_0$ to $Ca_i$). An output of this exclusive OR circuit becomes "0" when the output of the sense amplifier SA coincides with the address comparison signals $Ca_{i+1}$ to $Ca_n$ ($Ca_0$ to $Ca_i$) or "1" when these signals do not coincide. When all data of memory elements for storing a remedy address coincide, any one of the redundant word line selection signals $RWS_1$ to $RWS_p$ is activated. Moreover, when any one of the redundant word line selection signals $RWS_1$ to $RWS_p$ is selected, the sense amplifier circuit PR-SAM (or PR-BSAM) provided in the redundant memory mat PR-MAT (or redundant memory mat PR-BMAT) is activated and the switching signals RSDA1, RSDA1B (RSDA2, RSDA2B) to be supplied to the multiplexer MPX are generated. The switching signals RSDA1, RSDA1B are activated when the memory circuit corresponding to defective word line outputs the activated word line selection signal. Meanwhile, the switching signals RSDA2, RSDA2B are activated when the memory circuit PR-ADS corresponding to defective bit line outputs the activated word line selection signal.

The write signal RS, although not restricted particularly, is based on the corresponding assignment signal $AST_i$. For example, the signal RS illustrated in FIG. 7 is formed on the basis of the assignment signal $AST_1$. Of course, it is also possible to use in common the word lines for respective memory circuits. In this case, a signal which becomes a high level at the time of writing the remedy address is used as the signal RS.

Figure 8:
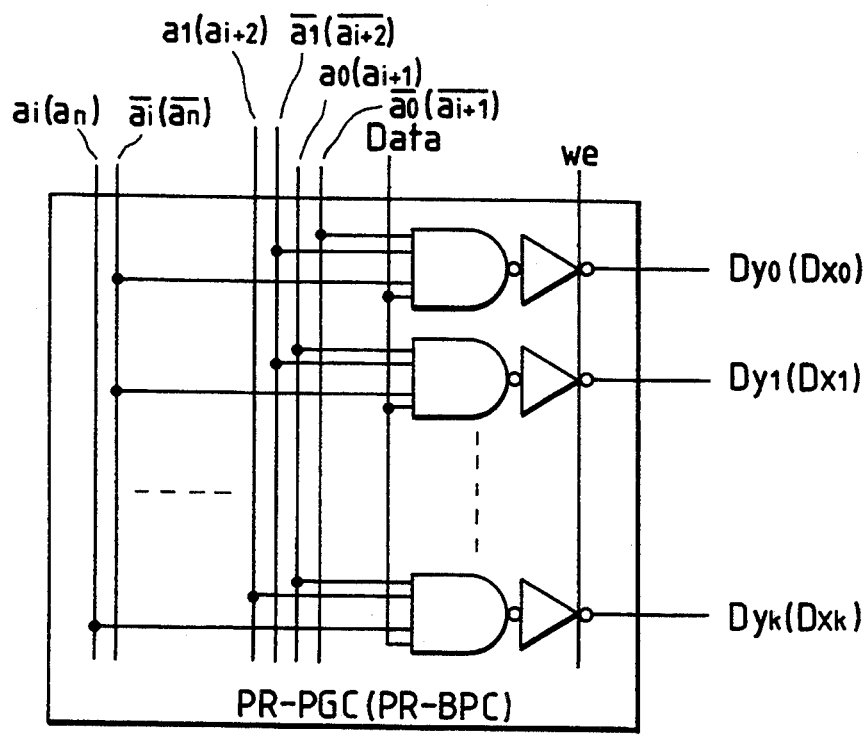
FIG. 8 illustrates a circuit diagram of an embodiment of a write data input circuit PR-PGC in the mask type ROM.

FIG. 8 illustrates a circuit diagram of an embodiment of the write data input circuit PR-PGC.

The write data input circuit PR-PGC decodes the complementary internal addresses $a_0$, $a_0B$ to $a_i$, $a_iB$ formed by the address buffer circuit ADB which receives the Y series address signals $A_0$ to $A_i$ and data Data and supplies the write data $Dy_0$ to $Dy_k$ to each data line of the redundant memory mat PR-MAT with the write signal we.

Figure 9:
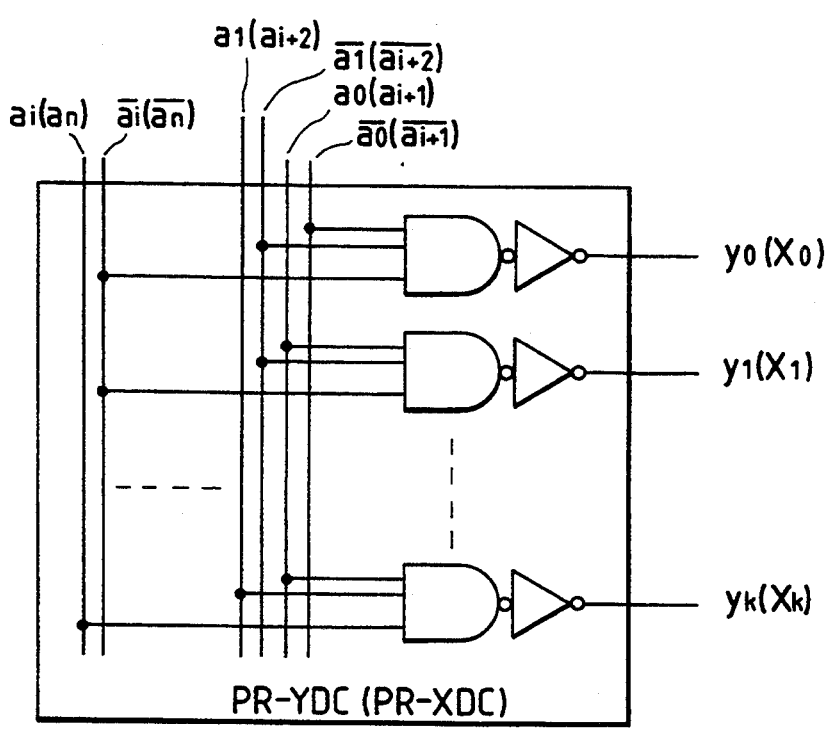
FIG. 9 illustrates a circuit diagram of an embodiment of a redundant Y(X) decoder circuit PR-YDC in the mask type ROM.

FIG. 9 illustrates a circuit diagram of an embodiment of the redundant Y decoder circuit PR-YDC.

This redundant Y decoder circuit PR-YDC decodes the complementary internal address signals $a_0$, $a_0B$ to $a_1$, $a_1B$ formed by the address buffer circuit ADB which receives the Y series address signals $A_0$ to $A_1$ to form the column selection signals $y_0$ to $y_k$ to be supplied to the column switch gate PR-YGT.

Figure 10:
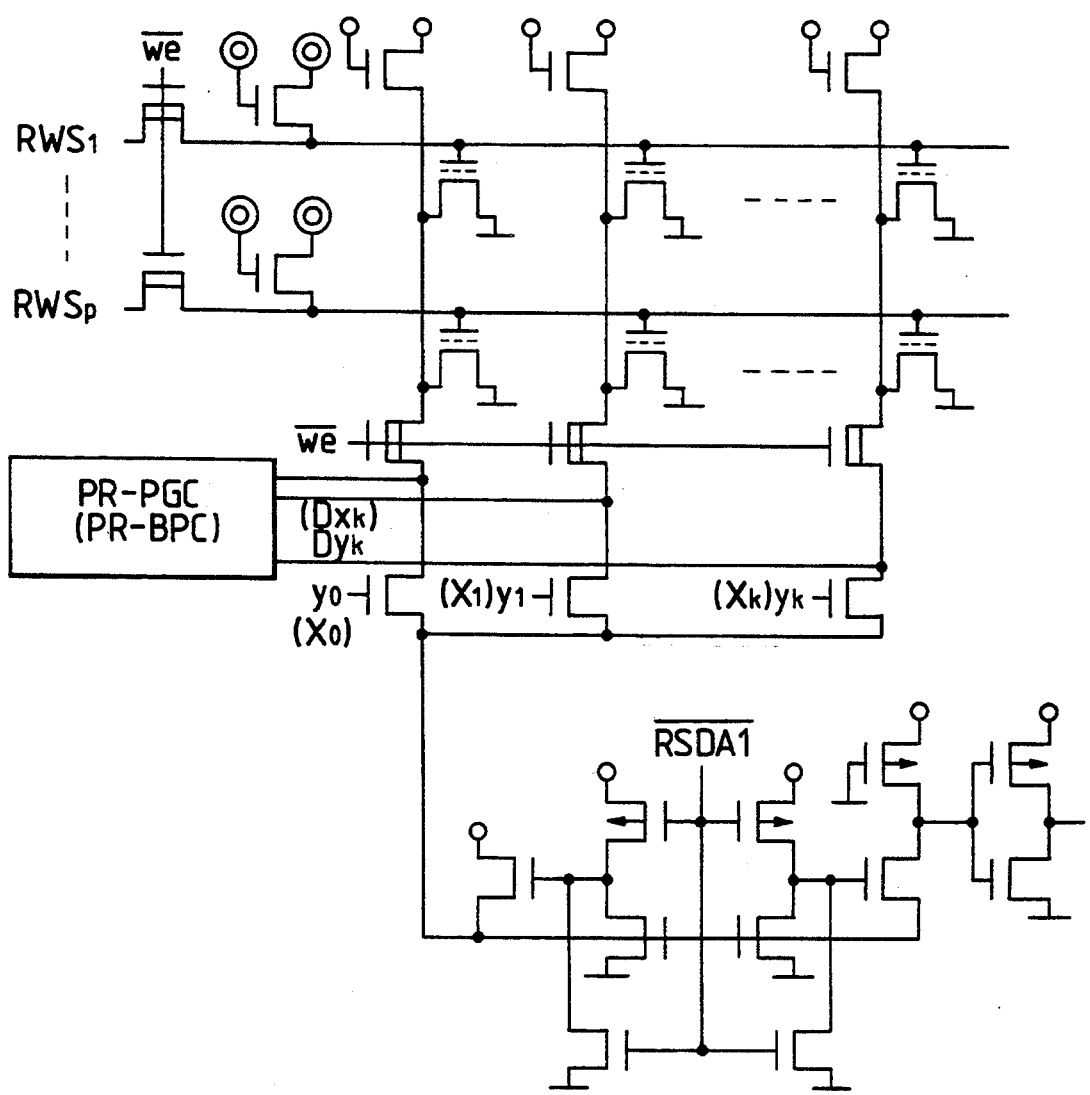
FIG. 10 illustrates a circuit diagram of an embodiment of a redundant memory mat PR-MAT, a column switch gate PR-YGT and a sense amplifier circuit PR-SAM.

FIG. 10 illustrates a circuit diagram of an embodiment of the redundant memory met PR-MAT, column switch gate PR-YGT and sense amplifier circuit PR-SAM. When eight redundant word lines are prepared, only one word line is selected corresponding to the redundant word line selection signals $RWS_1$ to $RWS_8$ and the non-volatile memory element of the single layer gate structure connected thereto is also selected. Each bit line forms a column switch gate PR-YGT through a depletion type MOSFET which receives the internal write control signal web and is connected to the common data line through MOSFET which is switchingly controlled by the selection signals $y_0$ to $y_k$. The sense amplifier is formed by a source input and a grounded gate amplifying type MOSFET, a P channel type MOSFET provided in the drain side thereof and a CMOS inverter circuit which receives an output signal thereof. The common data line includes an N channel type MOSFET which receives a signal level of common data line, an inversion amplifier circuit consisting of the P channel type load MOSFET provided in the drain side thereof and a source follower MOSFET which receives an output signal thereof to form a bias voltage of the common data line. With the similar bias circuit, a gate bias voltage of the amplifier MOSFET is set. The P channel type load MOSFET of the bias circuit is activated only during the operating period by the control signal RSDA1B. In addition, the source follower MOSFET for biasing the common data line and amplifier MOSFET are turned OFF during a non-operating period by the N channel type MOSFET which receives the signal PSDA1B.

The redundant memory mat PR-BMAT, column switch gate PR-BYGT and sense amplifier circuit PR-BSAM in the redundant circuit PR-DAB corresponding to defective bit line are similar to the circuit illustrated in FIG. 10.

The data input circuit PR-BPC for supplying the write data to the redundant circuit PR-DAS corresponding to defective data line resembles the data input circuit PR-PGC of FIG. 8. Namely, the data input circuit PR-BFC receives the X series address signals $a_{i+1}$, $a_{i+1}B$ to $a_n$, $a_nB$ in place of the address signals $a_0$, $a_0B$ to $a_i$, $a_iB$ end supplies the write data to the data line of the redundant memory mat PR-BMAT (refer to FIG. 10) within the redundant circuit PR-DAS. Thereby, the write data supplied to the data line designated by the X series address signal and is then written in the redundant memory mat PR-BMAT (refer to FIG. 8 and FIG. 10).

Moreover, the X series address signals $a_{i+1}$, $a_{i+1}B$ to $a_n$, $a_nB$ are supplied to the X series address decoder PR-XDC. This address decoder PR-XDC resembles they series address decoder PR-YDC. The X address signals $a_{i+1}$, $a_{i+1}B$ to $a_n$, $a_nB$ are decoded in place of the Y series address signals $a_0$, $a_0B$ to $a_i$, $a_iB$ to form the selection signals $X_0$ to $X_k$ (refer to FIG. 9). The generated selection signals $X_0$ to $X_k$ are used as the selection signal of the column switch gate PR-BYGT provided between the data line and common data line in the redundant memory mat PR-BMAT (refer to FIG. 10).

The data input circuit PR-BPC is used for writing data to the memory cells in the redundant circuit PR-DAS, while the X series address decoder PR-YDC is used for reading data from the memory cells in the redundant circuit PR-DAS.

In this embodiment, the X series address signals are supplied to the data input circuit PR-BPC but it is also possible to supply the Y series address signals in place of the X series address signals. In this case, the data input circuit PR-PGC may be used in place of the data input circuit PR-BPC, as indicated by a dash-and-dot line in FIG. 4.

Figure 11:
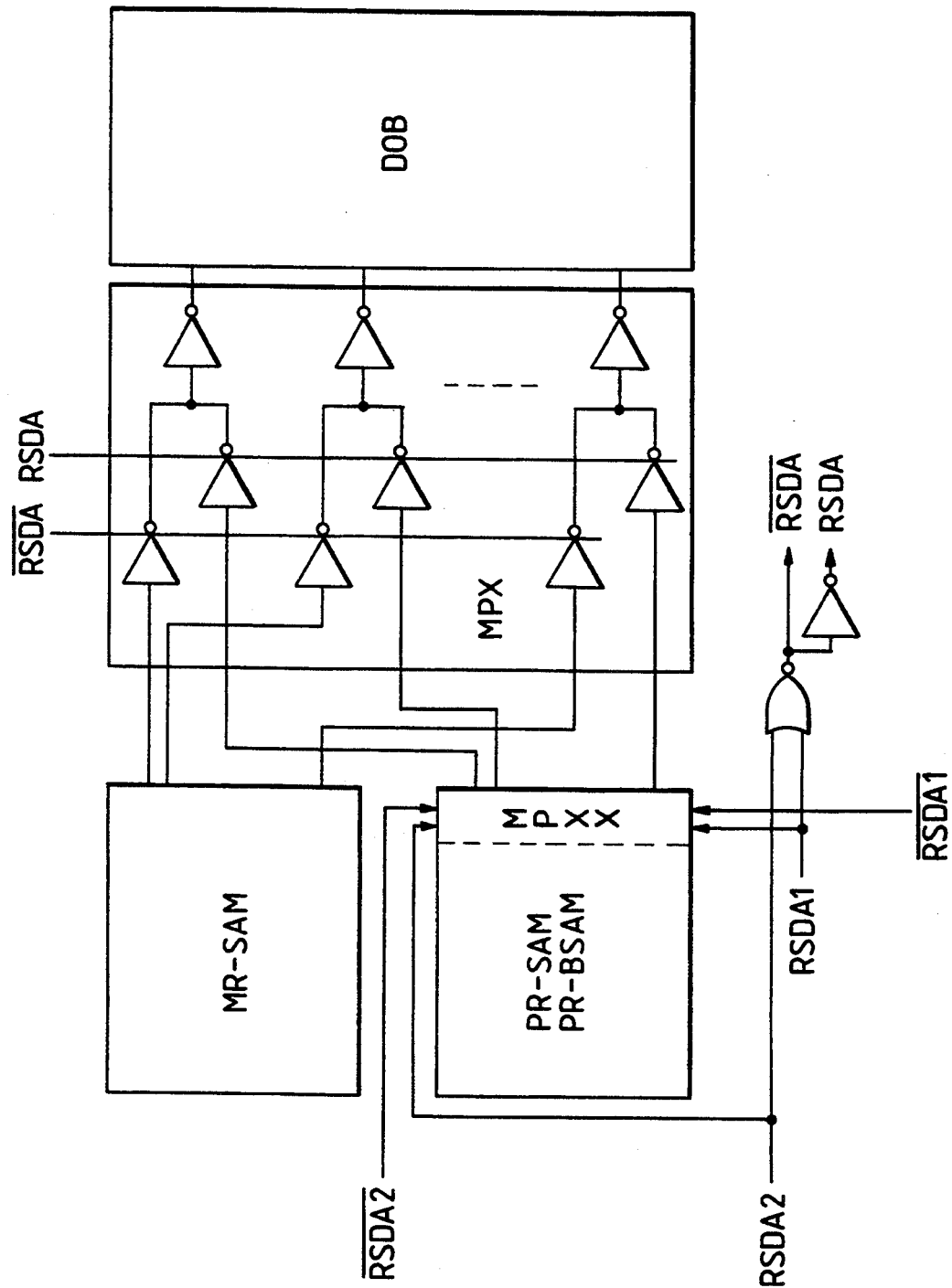
FIG. 11 illustrates a circuit diagram of an embodiment of a multiplexer MPX of the mask type ROM.

FIG. 11 illustrates a circuit diagram of an embodiment of the multiplexer MPX. In this embodiment, a clocked inverter circuit having the tristate output function is used. When the inverted switching signal RSDAB is activated, the clocked inverter circuit which receives the readout signal of the memory element selected in the memory mat MR-MAT forming the mask ROM is activated and transfers the readout signal to the output buffer circuit DOB. When the normal switching circuit RSDA is activated, the clocked inverter circuit which receives the readout signal of the memory element selected in the redundant memory mat PR-MAT or PR-BMAT is activated to transfer such readout signal to the output buffer circuit DOB. Namely, the correct data stored in the redundant memory mat PR-MAT or PR-BMAT is outputted in place of the readout data including a defective bit existing in the memory mat MR-MAT.

In FIG. 4, the redundant circuits corresponding to defective word lines are discriminated from the redundant circuits corresponding to defective bit lines for better understanding of the present invention. But, since these circuits are basically same in the structure, these are illustrated within only one black box. In this case, a multiplexer MPX is additionally provided in the output side of the sense amplifiers PR-SAM, PR-BSAM. This multiplexer MPXX is structured in the same manner as that explained above and selectively outputs an output of tile sense amplifier PR-SAM when output signals (switching signals) RSDA1, RSDA1B from the memory circuit PR-ADD are activated. Meanwhile, when the switching signals RSDA2, RADA2B from the memory circuit PR-ADS are activated, an output of the sense amplifier PR-BSAM is selectively outputted by the multiplexer.

The switching signal RADA1 (RADA2) becomes a high level when a written defective address matches with externally written input address within the memory circuit PR-ADD (PR-ADS). The switching signal RSDA becomes high level when the switching signal RSDA1 or RSDA2 becomes the switching level. Therefore, the switching signal RSDA is formed by a NOR gate which receives the switching signals RSDA1 and RSDA2 and an inverter which receives an output of such NOR gate.

Figure 12:
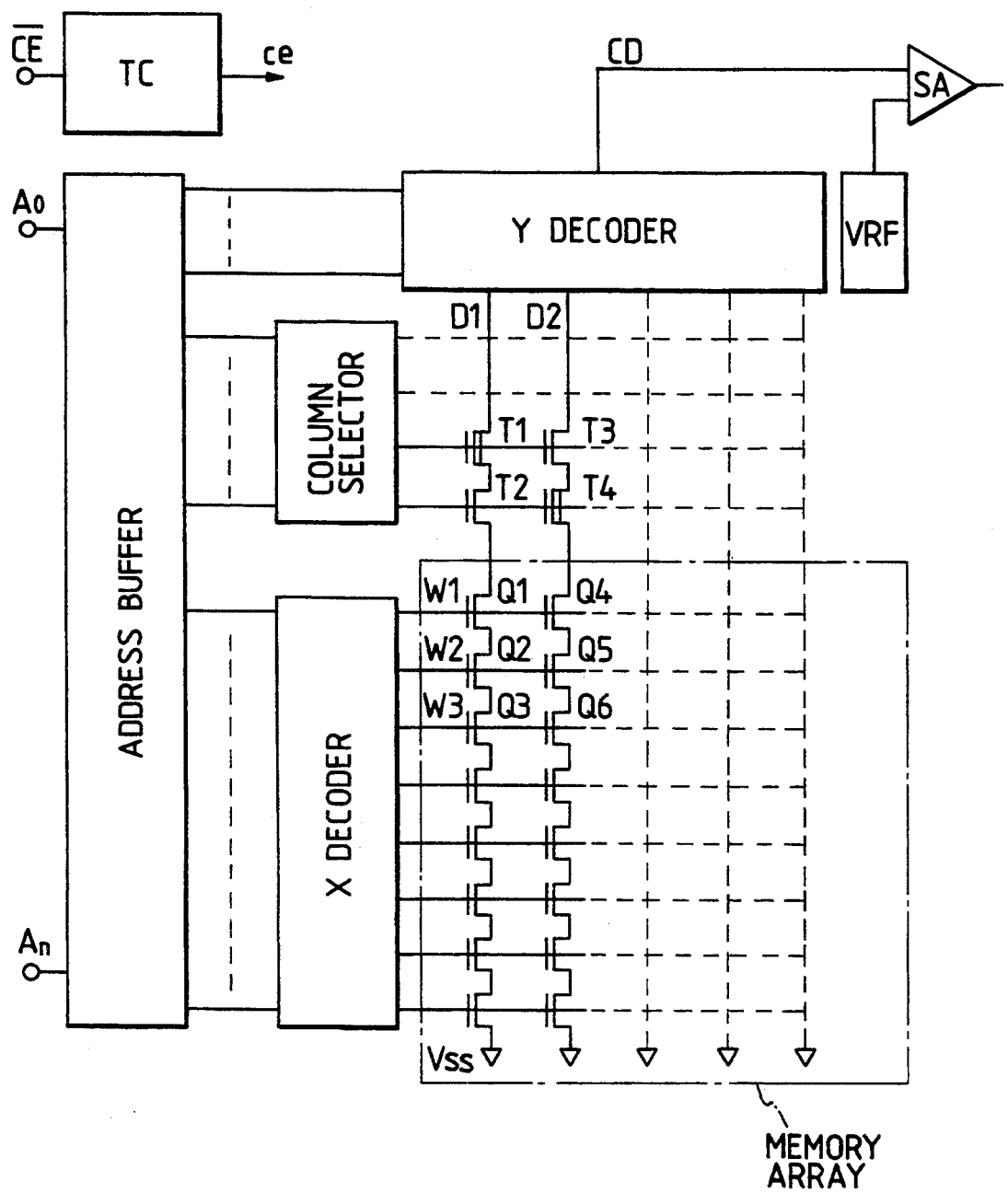
FIG. 12 illustrates a circuit diagram of another embodiment of the mask type ROM to which to which the present invention is applied.
Figure 13:
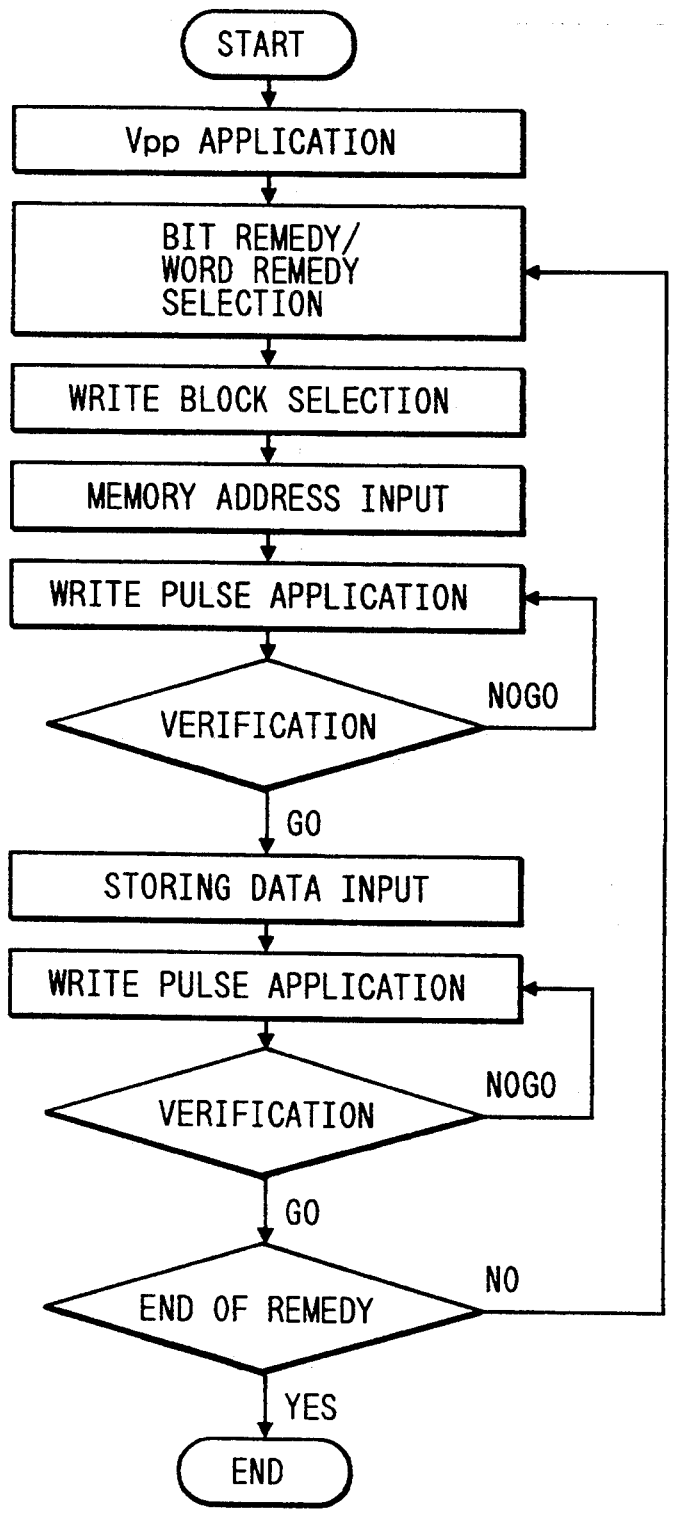
FIG. 13 illustrates a flowchart for explaining an embodiment of write operation to a remedy bit for the defect remedy.
Figure 14:
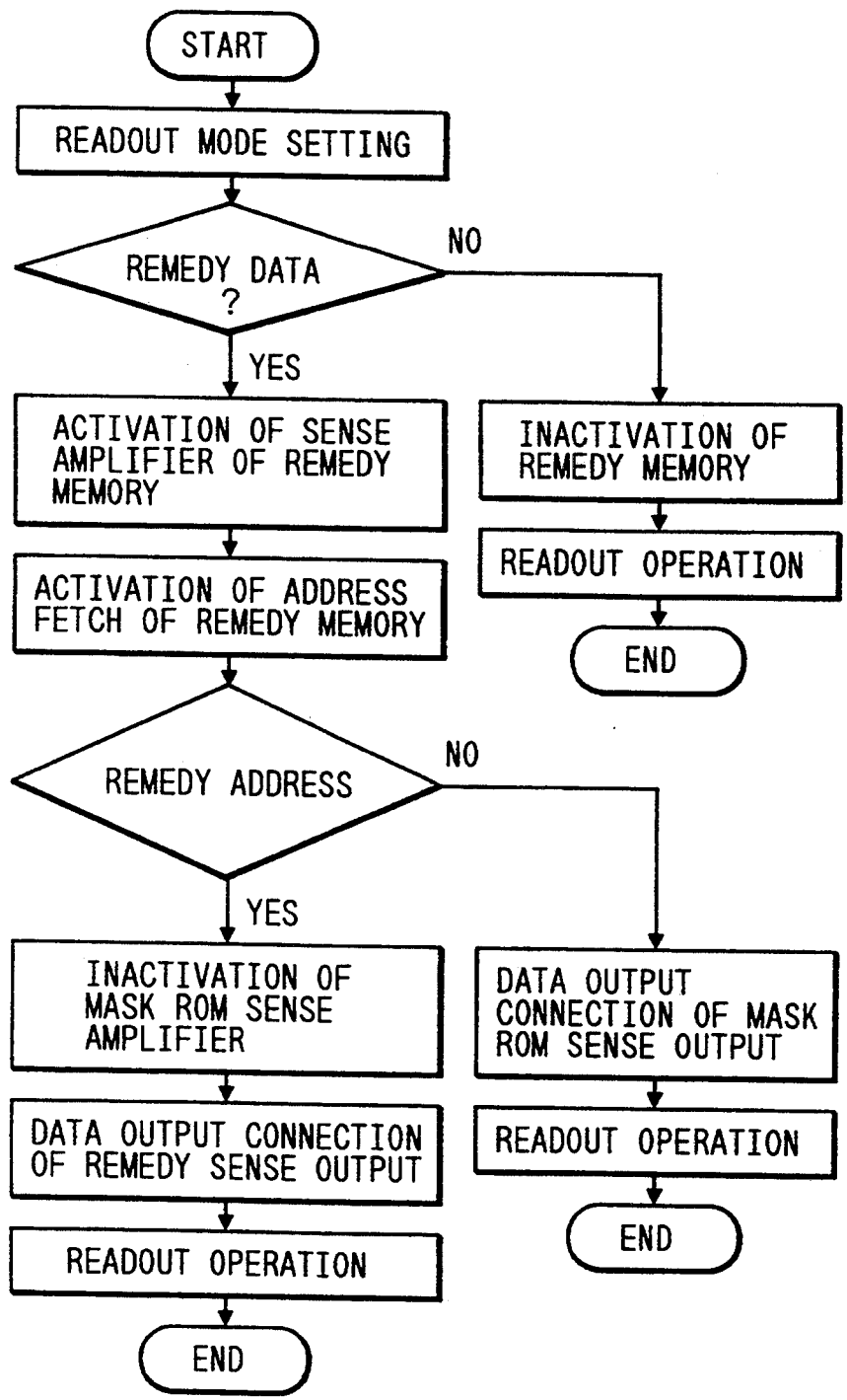

FIG. 12 illustrates a circuit diagram of another embodiment of a mask type ROM to which the present invention is applied. The mask ROM in this embodiment is structured by a plurality of serial circuits comprising a plurality of serial-connected N channel type MOSFETs. Writing of storing information to such memory element is carried out by the ion implantation method as explained previously. In FIG. 12, the depletion type MOSFET can be discriminated from an enhancement type MOSFET by adding a straight line to the channel part thereof.

A serial circuit corresponding to the one data line D1 typically indicated as an example is structured by column selection MOSFETT1, T2, etc. and data storing memories MOSFETQ1 to Q3. A serial circuit corresponding to other data line D2 typically indicated as an example adjacent to above serial circuit is structured by column selection MOSFETT3, T4 and data storing memories MOSFETQ4 to Q6. For example, the typically illustrated column selection MOSFETT1 and T4 are structured by depletion type MOSFET and MOSFETT2 and T3 by enhancement type MOSFET, respectively. When the other serial MOSFET which is omitted in the figure is turned ON, a selection signal supplied to the gates of T1, T3 is set to the low level by the column selector. When a selection signal supplied to the gates of T2 and T4 is set to the high level, both T1, T2 are turned ON, connecting the serial connected memories MOSFETQ1 to Q3 to the data line D1. Moreover, when a selection signal supplied to the gates of T1, T3 by the column selector is high level and a selection signal supplied to the gates of T2 and T4 is low level, both T3 and Ta are turned ON, connecting the serial connected memories MOSFETQ4 to Q6 to the data line D2. Accordingly, it is also possible, although not illustrated in the figure, to provide in parallel a plurality of serial circuits for respective data lines D1, D2.

The gates of memory MOSFETQm corresponding to the lateral direction among serial MOEFETs of memory array are respectively connected with typically illustrated word lines W1, W2, W3, etc. These words lines W1 to W3 are connected to corresponding output terminals of X decoder. The data lines D1, D2 are connected to a common data line CD through the Y decoder. The Y decoder illustrates the Y decoder itself and a column switch circuit consisting of a switch element which is switchingly controlled by its selection signal.

The common data line CD is connected to an input terminal of the sense amplifer SA. This sense amplifier SA senses and amplifies the high level and low level of a readout signal of the selected memory cell, by making reference to the reference voltage generated by a reference voltage generating circuit VRF.

Although not restricted particularly, it is also possible for the sense amplifier SA to execute the sense operation by making reference to the reference voltage formed by a dummy array consisting of the memory circuit having the same structure as the memory array explained above. The dummy array used is normally turned ON because the memories, MOSFETQm, are all structured by the enhancement type MOSFET and a power supply voltage Vcc is normally supplied to the gate thereof.

The address selecting operation of a vertical ROM in this embodiment will the explained hereunder.

The X decoder decodes an internal address signal supplied from a low address buffer and generates a decoded output which sets the selection level to a low level and the non-selection level to a high level. For example, when the 512 word lines are used, the selected one word line Is set to the low level, while the other 511 word lines remaining as the non-selected word lines are all set to the high level. Thereby, when the memory MOSFET coupled to the selected word line is a depletion type, a current path is formed to a serial circuit and when it is an enhancement type, a current path is not established. The Y decoder decodes an internal address signal supplied through an address buffer and connects only one selected data line among 512 lines to the common data line CD. Thereby, a readout signal in the selected one data line is amplified by the sense amplifier SA. In the case where data is read as the readout data in unit of a plurality of bits such as 8 bits or 16 bits, it is recommended to provide eight or sixteen memory arrays having such structure or simultaneously select eight or sixteen data lines with the Y decoder and then respectively provide the corresponding sense amplifiers and output circuits.

For the remedy of defect of such vertical type ROM, the non-volatile memory element as explained above can be used. The remedy address memory circuit and redundant memory mat utilizing such non-volatile memory elements are capable of using the circuit illustrated in FIG. 4.

FIG. 1B illustrates a flowchart for explaining an embodiment of the write operation to the remedy bit in the remedy of defect.

Although not restricted particularly, the mask type ROM in this embodiment detects a high voltage higher than 10V when it is applied from the terminal Vpp and switches the internal logic thereof to the remedy selection mode.

Continuously, bit line remedy or word line remedy is selected. This selection can be defined by an address to be supplied to the Y series address terminals $A_0$ to $A_1$. Namely, for the word line remedy, an address for instructing the assignment signals $AST_1$ to $AST_8$ assigned to the memory circuit PR-ADD is applied to the terminals $A_0$ to $A_1$ and for the bit line remedy, an address for instructing the assignment signals $ABT_9$ to $AST_{16}$ assigned to the memory circuit PR-ADS is applied to the terminals $A_0$ to $A_1$. The write area (write block) is selected within the memory circuits PR-ADD, PR-ADS by applying the desired address to the terminals $A_0$ to $A_1$. Next, the address to be remedied is applied to the X series address terminals $A_{1+1}$ to $A_n$ and such remedy address is written and Stored into the remedy memory. That is, the X series or Y series address to be remedied is written into the area corresponding to the instructed assignment signal.

Here, it is also possible, although not restricted particularly, to employ, as required, the writing method which has been used in the conventional writing for EPROM and the writing method by the algorithm for the write verification. Upon storing of address, a memory information (output data) is stored in the same manner as storing of address as explained previously, thereby completing the remedy. For the writing of memory information, the X series or Y series address to be remedied is supplied, for example, to the X series or Y series address terminal and the Y series or X series address for selecting the desired cell is supplied to the Y scribes or X series address terminal. Thereby, the word line selecting signal RWS, for the redundant memory mats PR-MAT, PR-BMAT is outputted from the memory circuit PR-ADD or PR-ADS, and a memory information is supplied and stored to the redundant memory mat from the data input circuit PR-PGC or PR-BPC.

Selection of bit line remedy or word line remedy may also be realized depending on a voltage of a control terminal by previously providing such control terminal. Moreover, in the case where the data input circuit PR-PGC is used in common with the input circuit PR-BPC, it is recommended that a latch circuit is provided to the selecting circuit RASC In order to individually define the address to be supplied as the address for comparison to the memory circuit PR-ADS and the address to be supplied to the data input circuit PR-PGC.

The writing operation explained above is carried out, although not restricted particularly, in the probing process when a circuit is completed on a semiconductor wafer. Namely, in the probing process, the readout test for the mask ROM is carried out, defective bit is detected from the test result, thereafter the remedy address is written and storing data corresponding to the remedy address is written. In the case of executing the remedy of defect, when the mask ROM is completed, a particular control terminal is unnecessary for writing remedy address and the data corresponding thereto by executing the writing operation in the probing process.

FIG. 12 illustrates a flowchart for explaining an embodiment of the remedy data reading operation.

When the readout mode is set by an external control signal, it is decided therein that remedy is necessary or not automatically by the remedy selection signal RSD stored at the time of selecting the write block during the remedy writing operation. If remedy is not carried out, the remedy circuit is left unactivated and the readout operation corresponding to external address of the memory area can be conducted.

When defect is remedied, the remedy memory area storing the address for remedy is activated and it is decided whether the external address matches the storing address. When the external address does not match the storing address, the data corresponding to the external address of the memory area is connected to the data output circuit for the readout operation. Meanwhile, when the external address matches the storing address, the sense amplifier of the memory is not activated and the sense amplifier for reading the remedy data being stored is activated and this output is connected to the data output circuit for the readout operation.

Figure 15:
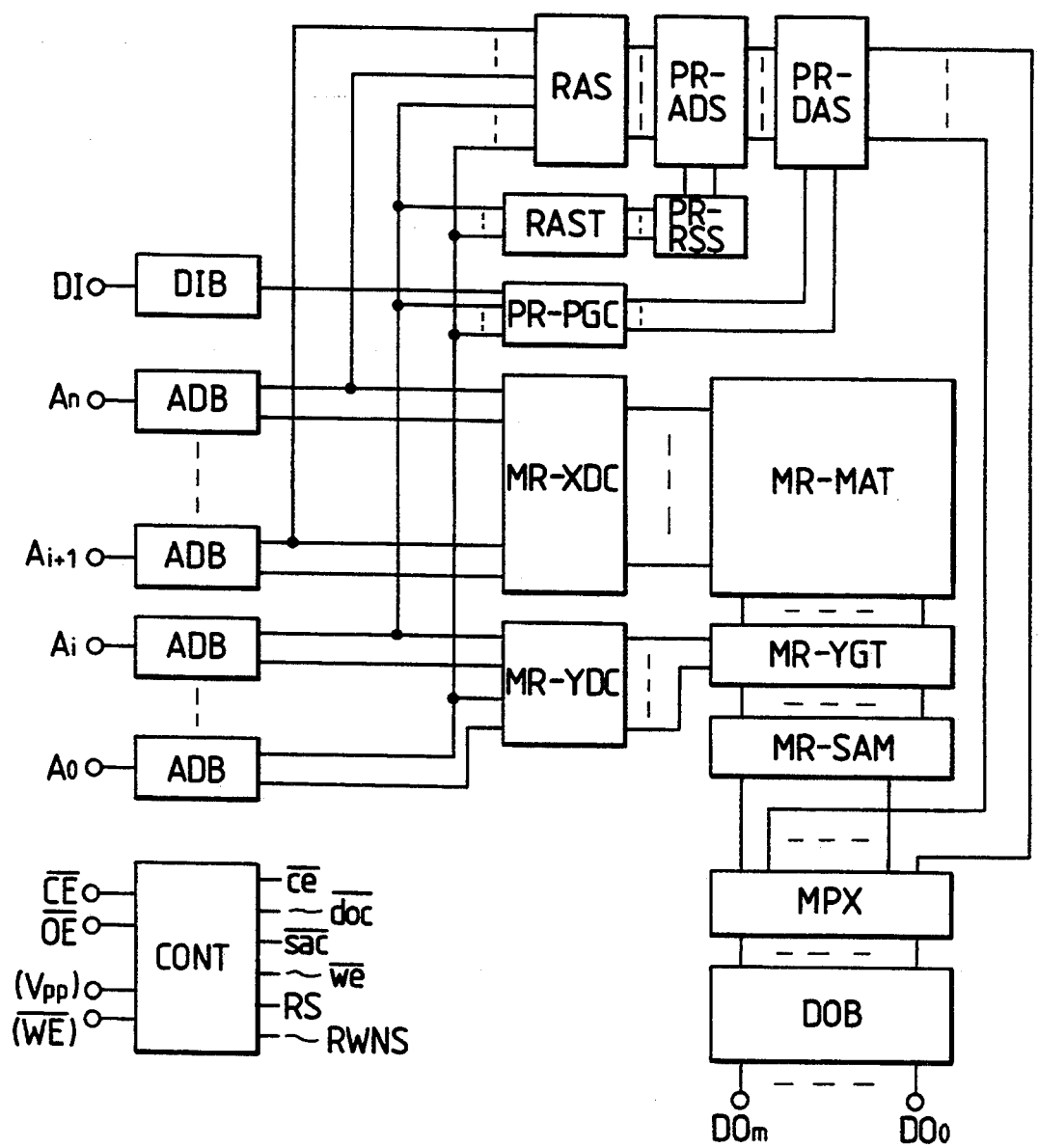
FIG. 15 illustrates a block diagram of another embodiment of the mask type ROM of the present invention.

FIG. 15 illustrates a block diagram of another embodiment of the mask type ROM of the present invention. In this embodiment, the redundant circuits PR-ADS, PR-DAS for bit line remedy are provided and thereby only the remedy corresponding to defective bit line is carried out. That is, the remedy area of the defective word lines is omitted from the embodiment shown in FIG. 4 and the redundant circuit is structured only by the remedy area of bit lines. That is, defect in the memory mat MR-MAT may be remedied only by the word line series or by bit line series.

The mask type ROM usually reads the data in unit of a plurality of bits. For example, in the case of 16 bits, a format of the 16 Mbits $\times$ 1048576 words is used. Because of such format, high speed access can be realized by reducing the number of memory cells connected with the one word line or bit line. For instance, it is considered that the memory area is divided into eight memory mats. Thereby the data is read in unit of 16 bits by reading the one memory mat with 2 bits respectively. In this case, one memory mat has the storing capacity of about 2 Mbits and the word lines are connected with about 2K memory cells, while the bit lines with about 1K memory cells, resulting in the storing capacity of about 2 Mbits in total.

Since eight memory mats are selected in parallel in this case and each memory mat provides an output of 2 bits, the data consisting of 16 bits in total can be read out. In the ROM of such memory mat structure, defects of word lines and bit lines are generated for each memory mat. Therefore, the redundant word lines and bit lines in this embodiment are given comparatively small storing capacity corresponding to the memory mat as explained above. In other words, in the case where data is read in unit of 16 bits, 16 bits are not replaced with the data from the redundant circuit and only 2 bits are replaced for each memory mat for the remedy of word lines and only 1 bit corresponding to one bit line is replaced for the remedy of bit lines. In such a structure, each memory mat cannot be designated externally. Therefore, an internal address memory area for designating memory mat is provided in the memory area of defective address. When the memory area is formed by eight memory mats, a mat designating and storing are of 3 bits is provided. Information of the mat designating and storing are is used for the signal when defective mat is not activated and moreover used as the selecting signal for replacing the readout data into an output bit.

FIG. 3 illustrates a plan view of another embodiment of a non-volatile memory element of the present invention.

In this figure, since an aluminium layer 15 forming the word lines WL is provided with a slit, the floating gate 8 is partly exposed. This slit is formed, although not restricted particularly, in such a rectangular form as being parallel with the word lines over-riding a couple of floating gates. When the word lines are extended covering entire surface of the floating gate in order to structure the barrier layer as explained above, the word lines become thicker thereby. When the word line becomes thicker as explained above, cracks are formed on the aluminium layer 15 and the lower insulating film 13 thereof as the word lines due to stress applied on the final passivation film, resulting in probability of deteriorating element characteristics. Therefore, in this embodiment, the aluminium layer working as the carrier layer is substantially formed thinner by providing a slit therein in view of preventing generation of cracks explained above.

Here, it is possible to extendingly form the aluminium layer 15 which structures the word lines WL in such a manner as covering a part of the floating gate. Moreover, it may be also possible to form the barrier layer covering a part or entire surface of the floating gate by extendingly form the aluminium layer 15 structuring the data lines DL or sources line SL in place of such aluminium layer. In addition, it is also possible to prevent generation of crack by providing the slit as explained above.

When the floating gate is partly exposed by providing the slit as explained previously, a semiconductor integrated circuit such as a non-volatile memory element of the single layer gate structure can be tested easily. Namely, the test of non-volatile memory element is conducted twice before and after wiring of data.

In the erasing process, the non-volatile memory element is set to the initial condition. That is, it is set to the condition where data is not yet written. The non-volatile memory element of the single layer gate structure provides, on the floating gate thereof, a barrier layer consisting of aluminium. This aluminium layer itself does not allow the ultraviolet ray to transmit therethrough but realizes erasing of data with diffraction or irregular reflection of ultraviolet ray. Particularly, effective erasing can be realized in such cases that the barrier layer is provided only at a part of the floating gate and the slit is provided like the embodiment explained above. Even in the case where the entire surface of floating gate is covered with the aluminium layer in order to prevent arrival of radical hydrogen to the floating gate from the final passivation film, since the barrier layer is extended from the floating gate within a short length, sufficient erasing can be realized with such diffraction and irregular reflection of the ultraviolet ray. Accordingly, since the redundant circuit may be used through the testing, reliable defect remedy can also be realized in addition to excellent data storing characteristic as explained heretofore.

The operations and effects of the embodiment of the present invention are as follow:

(1) Destruction of information charges accumulated in the floating gate can be prevented and highly reliable defect remedy can be realized using a non-volatile memory element having a simplified structure because the non-volatile memory element comprising a control gate formed by a diffusion layer, a floating gate comprising a conductive layer, said floating gate being partly overlapping with the control gate through a thin insulating layer, and a barrier layer formed to cover a part or the entire part of the floating gate is used as a defect remedy circuit for the memory circuit having read-only memory elements arranged in the form of a matrix and radical hydrogen which is estimated as to be diffused from the final passivation film of the element surface is seized by the barrier layer.

(2) The reliable and reasonable defect remedy can be ensured by realizing remedy for both word lines and bit lines.

While, the present invention has been described with respect to a specific embodiment thereof, it is to be understood that the present invention is not limited thereto in any way but covers any changes and modifications which will become possible without departing from the scope thereof. For example, the barrier layer may be located under the final passivation layer but above the floating gate layer. A non-volatile memory element of the single-layer structure can employ various patterns for embodiments. A memory cell and memory mat of mask type ROY can take various structures for embodiments. Moreover, a remedy address memory circuit can be modified in various manners. As the X decoder PR-XDC and Y decoder PR-YDC, the main X decoder MR-XDC, Y decoder MR-YDC may be used. The present invention can be applied widely for a semiconductor memory device such as a mask type ROM.

Figure 17:
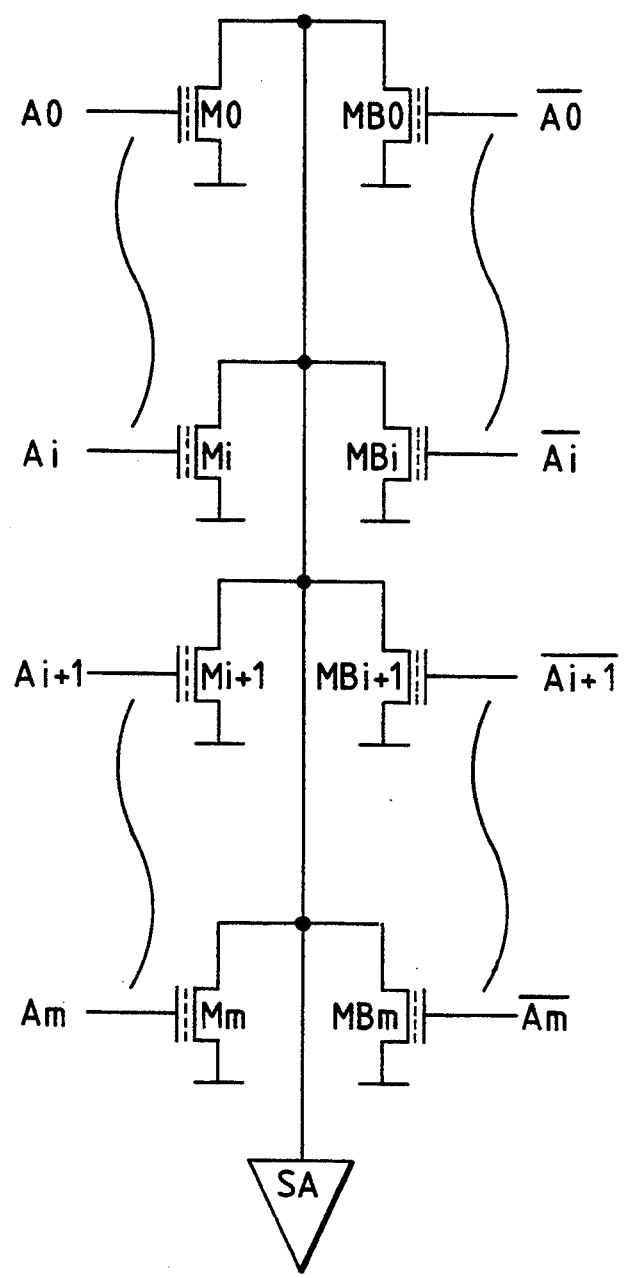
FIG. 17 illustrates a circuit diagram of another embodiment of a remedy address memory circuit.

Another embodiment of the remedy address memory circuit for storing remedy address is illustrated in FIG. 17.

In the same figure, $M_0$ to $M_m$, $MB_0$ to $MB_m$ are non-volatile memory elements (memory cells) of single layer gate structure, while $A_0$ to $A_m$ are input address signals and $A_0B$ to $A_mB$ are phase inverted signals of the input address signals $A_0$ to $A_m$. Moreover, SA indicates a sense amplifier.

In the case where the address signal $A_0$ is low and the address signals $A_1$ to $A_m$ are high as the addresses to be remedied, writing is carried out to the cells $MB_0$ and $M_1$ to $M_m$ of EPROM. When the addresses to be remedied ($A_0$=low, $A_1$ to $A_m$=high) are inputed under this condition, low level signal is applied to the gates of memory cells $MB_0$ and $MB_1$ to $MB_m$. Therefore, these memory cells $MB_0$ and $MB_1$ to $MB_m$ are cut-off without relation to the write operation. On the other hand, a high level signal is applied to the gates of the memory cells $MB_0$, $M_1$ to $M_m$, but since the writing is carried out to these cells, these are also cut-off. Accordingly, when the address matching with the stored address to be remedied is inputted, any current does not flow into the memory cell.

Meanwhile, for example, when an address such as the address signal $A_0$=high is inputted, since writing operation is not carried out to the memory cell $M_0$, this memory cell $M_0$ becomes ON, allowing a current to flow and thereby mismatching between the address stored in the remedy address memory circuit and the input address can be detected.

When writing is carried out to the memory cells $MB_{i+1}$ to $M_m$ and also to the memory cells $MB_{i+1}$ to $MB_m$, matching/mismatching between the remedy addresses stored in the memory cells $M_0$ to $M_i$, $MB_0$ to $MB_i$ and the input addresses $A_0$ to $A_j$ inputted to the gates of these memory cells can be detected without relation to the level of the input address signals $A_{1+1}$ to $A_m$. In the same manner, matching/mismatching between the remedy addresses stored in the memory cells $M_{1+1}$ to $M_m$, $MB_{1+1}$ to $MB_m$ and the input addresses $A_{1+1}$ to $A_m$ can also be detected by previously writing the data to the memory cells $M_0$ to $M_i$ and $MB_0$ to $MB_i$. Accordingly, the same remedy address memory circuit can be used both in the X and Y series and matching/mismatching can also be detected, for example, by assigning the memory cells $M_o$ to $M_i$, $MB_0$ to $MB_i$, and $A_0$ to $A_1$ to the X series addresses and the memory cells $M_{1+1}$ to $M_m$, $MB_{1+1}$ to $MB_m$ and $A_{1+1}$ to $A_m$ to the Y series addresses, based on the detection explained above. For storing and detection of a plurality of defective addresses smaller than the number (m+1) of addresses, the number of sense amplifier circuits (SA) can be more reduced in this embodiment. In above explanation, it has been indicated to use a redundant circuit for remedy of bits, bit lines and word lines including defects. However, it is also possible to use the redundant circuit explained above to change stored information of the mask type ROM without changing stored information of the regular memory mat.

Typical effects of the present invention will briefly explained hereunder. Namely, the non-volatile memory element comprising a control gate formed by a diffusion layer, a floating gate consisting of a conductive layer partly overlapping with the control gate through a thin insulating layer and a barrier layer formed covering a part or the entire part of the floating gate is used as a defect remedy circuit of the memory circuit arranging read-only memory elemens in the form of a matrix and radical hydrogen which is estimated as to be diffused from the final passivation film of the element surface is seized by the barrier layer explained previously, thereby destruction of information charges accumulated in the floating gate can be prevented and highly reliable defect remedy can be realized using a non-volatile memory element having a simplified structure.

What is claimed is:

1. A semiconductor memory device comprising:
   a memory matrix including a plurality of data lines, a plurality of word lines and a plurality of read only memory cells which are coupled to the data lines and to the word lines;
   a row decoder, coupled to the word lines, for selecting one of the word lines in accordance with row address signals;
   a column decoder for generating a selection signal in accordance with column address signals;
   a column selector, coupled to said column decoder and to the data lines, for selecting one of the data lines in accordance with the generated selection signal from said column decoder;
   a column redundant memory matrix including at least one redundant word line, a plurality of redundant data lines and a plurality of electrically programmable memory cells which are coupled to the redundant data lines and to said at least one redundant word line;
   a column redundant column decoder for generating a redundant selection signal in accordance with the row address signals;
   a column redundant selector, coupled to the redundant data lines and to said column redundant column decoder, for selecting at least one of the redundant data lines in accordance with the row address signals;
   column detection means, for detecting coincidence of the column address signals to be supplied to said column decoder with a defective column address signal which indicates a defective data line in said memory matrix, and for generating a redundant word line selection signal for selecting a respective redundant word line from said column redundant memory matrix; and
   output means, coupled to said column selector and to said column redundant selector, for selectively outputting an output from said column selector and said column redundant selector,
   whereby data stored in the electrically programmable memory cells of said column redundant memory matrix are read out in place of read only memory cells coupled to the defective data line of said memory matrix.

2. A semiconductor memory device according to claim 1, further comprising writing means, coupled to said column redundant memory matrix, for electrically writing data into the electrically programmable memory cells.

3. A semiconductor memory device according to claim 2, wherein each of the electrically programmable memory cells includes a control gate formed by a diffusion layer in a semiconductor body, and a floating gate including a conductive layer, said conductive layer partially overlapping a plan view area of said control gate through a thin insulating layer.

4. A semiconductor memory device according to claim 3, wherein each of the electrically programmable memory cells further includes a barrier layer which is formed above a principal surface of said semiconductor body and which has a portion for covering the entire floating gate corresponding thereto.

5. A semiconductor memory device according to claim 4, wherein said semiconductor body consists of a semiconductor substrate, wherein said diffusion layer consists of a first diffusion region, at the principal surface of said semiconductor substrate, and a high impurity concentration ohmic contact region formed therein, and wherein said ohmic contact region effects an electrical connection with a corresponding redundant word line.

6. A semiconductor memory device according to claim 2, further including a defective address storing circuit which stores defective column address signals and which includes a plurality of electrically programmable memory cells for storing the defective column address signals.

7. A semiconductor memory device according to claim 6, wherein each of the electrically programmable memory cells includes a control gate formed by a diffusion layer in a semiconductor body, and a floating gate including a conductive layer, said conductive layer partially overlapping a plan view area of said control gate through a thin insulating layer.

8. A semiconductor memory device according to claim 7, wherein each of the electrically programmable memory cells further includes a barrier layer which is formed above a principal surface of said semiconductor body and which has a portion for covering the entire floating gate corresponding thereto.

9. A semiconductor memory device according to claim 8, wherein said semiconductor body consists of a semiconductor substrate, wherein said diffusion layer consists of a first diffusion region, at the principal surface of said semiconductor substrate, and a high impurity concentration ohmic contact region formed therein, and wherein said ohmic contact region effects an electrical connection with a corresponding redundant word line.

10. A semiconductor memory device according to claim 6, wherein said column redundant memory matrix further includes redundant word lines and a plurality of electrically programmable memory cells which are coupled to the redundant data lines and the redundant word lines, and wherein one redundant word line is selected from said column redundant memory matrix in accordance with the redundant word line selection signal from said column detection means.

11. A semiconductor memory device according to claim 1, further comprising:
   a row redundant memory matrix including at least one redundant word line, a plurality of data lines and a plurality of electrically programmable memory cells which are coupled to said at Least one redundant word line and to the data lines thereof;
   a row redundant column decoder for generating a redundant selection signal in accordance with the column address signals;
   a row redundant column selector, coupled to the redundant data lines and to said row redundant column decoder, for selecting at least one of the redundant data lines in accordance with the column address signals;

row detection means, for detecting coincidence of the row address signals to be supplied to said row decoder with a defective row address signal which indicates a defective word line in said memory matrix, and for generating a redundant word line selection signal for selecting a respective redundant word line from said row redundant memory matrix; and output means, coupled to said column selector and to said row redundant column selector, for selectively outputting an output from said column selector and said row redundant column selector, whereby data stored in the electrically programmmable memory cells of said row redundant memory matrix are read out in place of read only memory cells coupled to the defective word line of said memory matrix.

12. A semiconductor memory device according to claim 11, further including a defective address storing circuit which stores defective row address signals and which includes a plurality of electrically programmable memory cells for storing the defective row address signals.

13. A semiconductor memory device according to claim 12, wherein each of the electrically programmable memory cells of said row redundant memory matrix and of said defective address storing circuit includes a control gate formed by a diffusion layer in a semiconductor body, and a floating gate including a conductive layer, said conductive layer partially overlapping a plan view area of said control gate through a thin insulating layer.

14. A semiconducter memory device according to claim 13, wherein each of the electrically programmable memory cells further includes a barrier layer which is formed above a principal surface of said semiconductor body and which has a portion for covering the entire floating gate corresponding thereto.

15. A semiconductor memory device according to claim 14, wherein said semiconductor body consists of a semiconductor substrate, wherein said diffusion layer consists of a first diffusion region, at the principal surface of said semiconductor substrate, and a high impurity concentration ohmic contact region formed therein, and wherein said ohmic contact region effects an electrical connection with a corresponding redundant word line.

16. A semiconductor memory device according to claim 8, further comprising:

a row redundant memory matrix including at least one redundant word line, a plurality of data lines and a plurality of electrically programmable memory cells which are coupled to said at least one redundant word line and to the data lines thereof;

a row redundant column decoder for generating a redundant selection signal in accordance with the column address signals;

a row redundant column selector, coupled to the redundant data lines and to said row redundant column decoder, for selecting at least one of the redundant data lines in accordance with the row address signals;

row detection means, for detecting coincidence of the row address signals to be supplied to said row decoder with a defective row address signal which indicates a defective word line in said memory matrix, and for generating a redundant word line selection signal for selecting a respective redundant word line from said row redundant memory matrix; and output means, coupled to said column selector and to said row redundant column selector, for selectively outputting an output from said column selector and said row redundant column selector, whereby data stored in the electrically programmable memory cells of said row redundant memory matrix are read out in place of read only memory cells coupled to the defective word line of said memory matrix.

17. A semiconductor memory device according to claim 16, further including a defective address storing circuit which stores defective row address signals and which includes a plurality of electrically programmable memory cells for storing the defective row address signals.

18. A semiconductor memory device according to claim 17, wherein each of the electrically programmable memory cells of said row redundant memory matrix and of said defective address storing circuit includes a control gate formed by a diffusion layer in a semiconductor body, and a floating gate including a conductive layer, said conductive layer partially overlapping a plan view area of said control gate through a thin insulating layer.

19. A semiconductor memory device according to claim 18, wherein each of the electrically programmable memory cells further includes a barrier layer which is formed above a principal surface of said semiconductor body and which has a portion for covering the entire floating gate corresponding thereto.

20. A semiconductor memory device according to claim 19, wherein said semiconductor body consists of a semiconductor substrate, wherein said diffusion layer consists of a first diffusion region, at the principal surface of said semiconductor substrate, and a high impurity concentration ohmic contact region formed therein, and wherein said ohmic contact region effects an electrical connection with a corresponding redundant word line.

21. A semiconductor memory device comprising:

a memory matrix including a plurality of data lines, a plurality of word lines and a plurality of read only memory cells which are coupled to the data lines and to the word lines;

a row decoder, coupled to the word lines, for selecting one of the word lines in accordance with row address signals;

a column decoder for generating a selection signal in accordance with column address signals;

a column selector, coupled to said column decoder and to the data lines, for selecting one of the data lines in accordance with the generated selection signal from said column decoder;

a redundant memory matrix including a plurality of redundant word lines, a plurality of redundant data lines and a plurality of electrically programmable memory cells which are coupled to the redundant data lines and to said redundant word lines;

a row redundant column decoder for generating a row redundant selection signal in accordance with the column address signals;

a column redundant column decoder for generating a column redundant selection signal in accordance with the row address signals;

a redundant column selector, coupled to the redundant data lines, to the row redundant column decoder and to the column redundant column decoder, for selecting at least one of the redundant data lines in accordance with one of the column address signals and the row address signals;

detection means for detecting defects in said memory matrix, including means for detecting coincidence of the row address signals to be supplied to said row decoder with a defective row address signal which indicates a defective word line in said memory matrix and for generating a redundant word line selection signal for selecting one of the redundant word lines, and means for detecting coincidence of the column address signals to be supplied to said column decoder with a defective column address signal which indicates a defective data line in said memory matrix and for generating a redundant word line selection signal for selecting one of the redundant word lines; and output means, coupled to said column selector and to said redundant selector, for selectively outputting an output from said column selector and said redundant selector, whereby data stored in the electrically programmable memory cells of said redundant memory matrix are read out in place of read only memory cells coupled to one of the defective word line and the defective data line of said memory matrix.

22. A semiconductor memory device according to claim 21, wherein each of the electrically programmable memory cells includes a control gate formed by a diffusion layer in a semiconductor body and a floating gate including a conductive layer, said conductive layer partially overlapping a plan view area of said control gate through a thin insulating layer.

23. A semiconductor memory device according to claim 22, wherein each of the electrically programmable memory cells further includes a barrier layer which is formed above a principal surface of said semiconductor body and which has a portion for covering the entire floating gate corresponding thereto.

24. A semiconductor memory device according to claim 23, further comprising writing means, coupled to said redundant memory matrix, for electrically writing data into the electrically programmable memory cells.

25. A semiconductor memory device according to claim 23, further including a defective address storing circuit which stores defective row address signals and defective column address signals and which includes a plurality of electrically programmable memory cells.

26. A semiconductor memory device according to claim 25, further comprising writing means coupled to the defective address storing circuit for electrically writing data into the electrically programmable memory cells.

27. A semiconductor memory device according to claim 26, further comprising writing means coupled to the redundant memory matrix for electrically writing data into the electrically programmable memory cells.

28. A semiconductor memory device according to claim 27, wherein said semiconductor body consists of a semiconductor substrate, wherein said diffusion layer consists of a first diffusion region, at the principal surface of said semiconductor substrate, and a high impurity concentration ohmic contact region formed therein, and wherein said ohmic contact region effects an electrical connection with a corresponding redundant word line.

* * * * *